United States Patent
Barraud et al.

(10) Patent No.: US 12,527,082 B2
(45) Date of Patent: Jan. 13, 2026

(54) MICROELECTRONIC DEVICE WITH TWO FIELD-EFFECT TRANSISTORS HAVING A COMMON ELECTRODE

(71) Applicant: COMMISSARIAT A L'ENERGIE ATOMIQUE ET AUX ENERGIES ALTERNATIVES, Paris (FR)

(72) Inventors: Sylvain Barraud, Grenoble (FR); Joris Lacord, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 314 days.

(21) Appl. No.: 18/339,325

(22) Filed: Jun. 22, 2023

(65) Prior Publication Data
US 2024/0038764 A1    Feb. 1, 2024

(30) Foreign Application Priority Data
Jun. 22, 2022 (FR) ..................... 22 06161

(51) Int. Cl.
*H10D 86/00*   (2025.01)
*H03K 17/687*  (2006.01)
*H10D 30/63*   (2025.01)

(52) U.S. Cl.
CPC ......... *H10D 86/201* (2025.01); *H03K 17/687* (2013.01); *H10D 30/637* (2025.01)

(58) Field of Classification Search
CPC ... H10D 86/201; H10D 30/637; H03K 17/687
See application file for complete search history.

(56) References Cited

U.S. PATENT DOCUMENTS 5,981,983 A * 11/1999 Funaki ............... H10D 12/421
                                                257/341
6,372,557 B1 * 4/2002 Leong ............... H10D 30/603
                                                257/E29.268

(Continued)

FOREIGN PATENT DOCUMENTS

WO    WO 2021/050194 A1    3/2021

OTHER PUBLICATIONS

Sorin Cristoloveanu, et al., "A Review of Sharp-Switching Devices for Ultra-Low Power Applications", IEEE Journal of the Electron Devices Society, vol. 4, No. 5, 2016, pp. 215-226.

(Continued)

*Primary Examiner* — Eugene Lee
(74) *Attorney, Agent, or Firm* — Oblon, McClelland, Maier & Neustadt, L.L.P.

(57) ABSTRACT

A microelectronic device includes a first transistor having a first drain and a first source, a first doped zone constituting one from among the first drain and the first source, a second doped zone constituting the other from among the first drain and the first source, a second transistor comprising a second drain and a second source, a third doped zone constituting the second source or the second drain, a fourth doped zone constituting the other from among the second drain and the second source, a dielectric layer having an upper face in contact with the four doped zones and a rear gate in contact with a lower face of the dielectric layer. The second doped zone and the fourth doped zone form a common electrode.

18 Claims, 18 Drawing Sheets

(56) References Cited

U.S. PATENT DOCUMENTS

| | | | |
|---|---|---|---|
| 7,759,745 B2* | 7/2010 | Komori | H10D 84/038 |
| | | | 257/900 |
| 10,680,105 B2* | 6/2020 | Han | H10B 51/30 |
| 2005/0042832 A1* | 2/2005 | Oh | H10D 84/0188 |
| | | | 257/E21.654 |
| 2011/0187412 A1 | 8/2011 | Ma et al. | |
| 2014/0167167 A1 | 6/2014 | Hasbani et al. | |
| 2022/0269933 A1* | 8/2022 | Das | H10D 84/08 |
| 2024/0030221 A1* | 1/2024 | Barraud | H03K 17/687 |

OTHER PUBLICATIONS

Fenouillet-Beranger et al. "Hybrid FDSOI/Bulk high-k/Metal gate platform for Low Power (LP) multimedia technology", IEEE International Electron Device Meeting (IEDM) Technical Digest, 2009, p. 667-670.

French Preliminary Search Report issued Feb. 14, 2023 in French Application 22 06161 filed on Jun. 22, 2022, 9 pages (with English Translation of Categories of Cited Documents and Written Opinion).

* cited by examiner

| Parameters | Values |
|---|---|
| $V_{G1} = V_{G2}$ | [-0,5V, 0V] |
| $V_{DS}$ | 0,5V |
| $V_{BG}$ | [-1V, 1V] |

| Parameters | Values |
|---|---|
| $V_{G1} = V_{G2}$ | [0V, 0,5V] |
| $V_{DS}$ | 0,5V |
| $V_{BG}$ | [-1V, 1V] |

| Parameters | Values |
|---|---|
| $V_{G1} = -V_{G2}$ | [0V, 0,05V] |
| $V_{DS}$ | 0,5V |
| $V_{BG}$ | [-1V, 1V] |

| Parameters | Values |
|---|---|
| $V_{G1} = V_{G2}$ | [-1V,1V] |
| $V_{DS}$ | 50mV |
| $V_{BG}$ | [-2V,2V] |
| $e_{300}$ | 10nm |

| Parameters | Values |
|---|---|
| $V_{G1} = V_{G2}$ | [-1V, 1V] |
| $V_{DS}$ | 50mV |
| $V_{BG}$ | [-2V, 2V] |
| $e_{300}$ | 5nm |

| Parameters | Values |
|---|---|
| $V_{G1} = -V_{G2}$ | [-1V, 1V] |
| $V_{DS}$ | 50mV |
| $V_{BG}$ | [-2V, 2V] |
| $e_{300}$ | 10nm |

| Parameters | Values |
|---|---|
| $V_{G1}/V_{G2}$ | 0V |
| $V_{DS}$ | 50mV |
| $V_{BG}$ | [-1,5V, 1,5V] |

| Parameters | Values |
|---|---|
| $V_{G1}/V_{G2}$ | 0V |
| $V_{DS}$ | 50mV |
| $V_{BG}$ | [-1,5V, 1,5V] |
| $V_G$ | <0V ; >0V |

| Parameters | Values |
|---|---|
| $V_{G1}/V_{G2}$ | 0V |
| $V_{DS}$ | 50mV |
| $V_{BG}$ | [-1,5V,1,5V] |

| Parameters | Values |
|---|---|
| $V_{G1}/V_{G2}$ | 0V |
| $V_{DS}$ | 50mV |
| $V_{BG}$ | [-1,5V,1,5V] |
| $V_G$ | <0V ; >0V |

MICROELECTRONIC DEVICE WITH TWO FIELD-EFFECT TRANSISTORS HAVING A COMMON ELECTRODE

TECHNICAL FIELD

The present invention relates to the microelectronics field and more specifically, advanced CMOS (Complementary Metal Oxide Semiconductor) technologies. It has a particularly advantageous application in the field of machine learning.

STATE OF THE ART

Different types of transistors are currently used in electronic circuits to perform numerous functions (logic circuits, amplification, signal modulation, etc.).

One of the structures currently most used is the FDSOI (Fully Depleted Silicon On Insulator) transistor, represented in FIG. 10. This technology consists of placing a thin insulating layer under the semiconductor layer, for example made of silicon, so as to create a barrier making it possible, in particular, to avoid current leakages. FDSOI transistors are favoured in low-consumption applications.

$Z^2$FET transistors are, themselves, in particular used for memory applications. This a direct biased p-i-n diode, the intrinsic channel of which is only partially covered by a front gate.

An aim of the present invention is to propose an alternative to current devices, while having a performance which is at least equivalent and/or making it possible to perform functions for which all current devices cannot be used.

SUMMARY

To achieve this aim, a first aspect relates to a microelectronic device comprising:
- a first field-effect transistor comprising a first drain, a first source, a first gate and a first gate dielectric,
- a first doped zone, constituting one from among the first drain and the first source,
- a second doped zone, constituting the other from among the first drain and the first source, The device comprises, in addition:
- a second field-effect transistor comprising a second drain, a second source, a second gate and a second gate dielectric,
- a third doped zone, constituting the second source if the first doped zone constitutes the first drain, or the second drain, if the first doped zone constitutes the first source,
- a fourth doped zone, constituting the other from among the second drain and the second source,
- a dielectric layer having an upper face in contact with the first doped zone, with the second doped zone, with the third doped zone and with the fourth doped zone,
- a rear gate in contact with a lower face of the dielectric layer, It further has the particularity that the second doped zone and the fourth doped zone form a common electrode.

The aim thus defined constitutes a microelectronic device which could replace, in numerous applications, the transistors currently used. This device can further have new functionalities with respect to current devices. Advantageously, it makes it possible to generate current-voltage features having a Gaussian-type form, which can be used, for to example, in memory or machine learning applications.

A second aim relates to a non-volatile memory storage unit comprising a device such as defined above.

A third aim relates to a method for controlling the device or the storage unit, wherein the first control voltage $V_{110}$ is applied to the first doped zone and the second control voltage $V_{210}$ is applied to the first doped zone, and wherein:
- The first control voltage $V_{110}$ constitutes a source voltage $V_S$ of the device and the second control voltage $V_{210}$ constitutes a drain voltage $V_D$ of the device, or
- The second control voltage $V_{210}$ constitutes the source voltage $V_S$ of the device and the first control voltage $V_{110}$ constitutes the drain voltage $V_D$ of the device.

BRIEF DESCRIPTION OF THE FIGURES

The aims, objectives, as well as the features and advantages of the invention will emerge best from the detailed description of an embodiment of the latter which is illustrated by the following accompanying drawings, wherein.

Figure 1A:
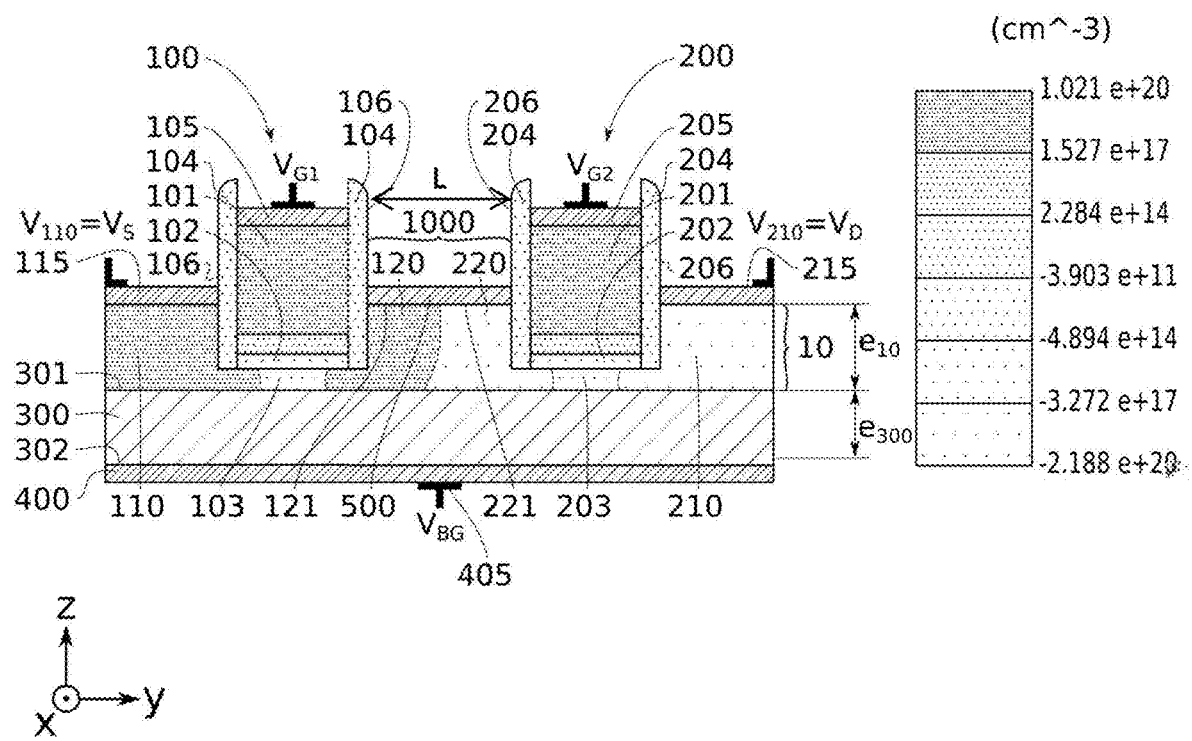
FIGS. 1A to 1F each represent a device according to an embodiment of the invention.

The drawings are given as examples and are not limiting of the invention. They constitute principle schematic representations intended to facilitate the understanding of the invention and are not necessarily to the scale of practical applications. In particular, the dimensions are not representative of reality.

DETAILED DESCRIPTION

Before starting a detailed review of embodiments of the invention, optional features are stated below which can optionally be used in association or alternatively:

According to an embodiment, the second doped zone and the fourth doped zone are electrically connected by an electrically conductive layer, preferably metal.

According to an example, the electrically conductive layer is metal silicide-based.

According to an example, the electrically conductive layer directly covers at least one part of an upper face of the second doped zone and at least one part of an upper face of the fourth doped zone.

According to an example, the electrically conductive layer directly covers a part of the upper face of the dielectric layer and separates the second doped zone of the fourth doped zone.

According to an example, the second doped zone and the fourth doped zone have distinct dopings from among an N-type doping and a P-type doping.

According to an embodiment, the device comprises a first electrode and a second electrode, the first doped zone is in contact with the first electrode which is configured to receive a first control voltage $V_{110}$ and the third doped zone is in contact with the second electrode which is configured to receive a second control voltage $V_{210}$.

According to an example:
The first control voltage $V_{110}$ constitutes a source voltage $V_S$ of the device and the second control voltage $V_{210}$ constitutes a drain voltage $V_D$ of the device, or
The second control voltage $V_{210}$ constitutes the source voltage $V_S$ of the device and the first control voltage $V_{110}$ constitutes the drain voltage $V_D$ of the device.

According to an example, the device further comprises a first gate electrode and a second gate electrode, the first gate is in contact with the first gate electrode which is configured to receive the application of a first gate voltage $V_{G1}$ and the second gate is in contact with the second gate electrode which is configured to receive the application of a second gate voltage $V_{G2}$.

According to an embodiment, the device comprises a rear gate electrode and the rear gate is in contact with the rear gate electrode which is configured to receive the application of a rear gate voltage $V_{BG}$.

According to an embodiment, the device further comprises a control circuit configured to apply:
the first control voltage $V_{110}$ on the first electrode,
the second control voltage $V_{210}$ on the second electrode,
the first gate voltage $V_{G1}$ on the first electrode,
the second gate voltage $V_{G2}$ on the second electrode,
the rear gate voltage $V_{BG}$ on the rear gate electrode,
the first control voltage $V_{110}$, the second control voltage $V_{210}$, the first gate voltage $V_{G1}$, the second gate voltage $V_{G2}$ and the rear gate voltage $V_{BG}$ could take different values and at least values of between −5 and 5V.

According to an example, $V_{G2}=\pm V_{G1}+\Delta V_G$, and with $\Delta V_G$ of between −5 and +5V.

According to an example, $V_{G2}=V_{G1}$.

According to an example, $V_{G2}=-V_{G1}$.

According to an example, the first transistor and the second transistor are separated by a distance L greater than 50 nm, and/or less than 500 nm.

According to an embodiment, the second doped zone and the fourth doped zone have a doping of the same type from among an N-type doping and a P-type doping, and the first doped zone and the third doped zone have a doping of the other type.

According to an example, the dielectric layer has a thickness $e_{300}$ between its lower face and its upper face less than or equal to 25 nm, preferably less than 5 nm.

According to an embodiment, the first gate dielectric and the second gate dielectric are with the basis of a ferroelectric material.

It is specified that, in the scope of the present invention, the terms "on", "surmounts", "covers", "underlying", "opposite" and their equivalents do not necessarily mean "in contact with". Thus, for example, the deposition, the transfer, the adhesion, the assembly or the application of a first layer on a second layer, does not compulsorily mean the two layers are directly in contact with one another, but means that the first layer covers at least partially the second layer by being, either directly in contact with it, or by being separated from it by at least one other layer or at least one other element.

A layer can moreover be composed of several sublayers of one same material or of different materials.

By a substrate, a layer, a device "with the basis of" a material M, this means a substrate, a layer, a device comprising this material M only or this material M and optionally other materials, for example, alloy elements, impurities or doping elements. Thus, a material with the basis of a IV-IV (or III-N) material can comprise a IV-IV material added with dopants. Likewise, a GaN-based layer typically comprises GaN and AlGaN or InGaN alloys.

The term "III-V material" makes reference to a semiconductor composed of one or more elements of column III and of column V of Mendeleev's periodic table. Among the elements of column III, there are boron, gallium, aluminium or also indium. Column V contains, for example, nitrogen, arsenic, antimony and phosphorus.

In the scope of this invention, by "electrically conductive" material, this means a material having an electrical conductivity level greater than $0.5\times10^6$ S/m (1 Siemens=1S=1 $m^{-2} \cdot kg^{-1} \cdot s^3 \cdot A^2$).

A system, preferably orthonormal, comprising the axes x, y, z is represented in FIG. 1A. This system is applicable by extension to the other figures.

In the present Patent application, thickness will preferably be referred to for a layer, and height for a structure or a device. The thickness is taken along a direction normal to the main extension plane of the layer, and the height is taken perpendicularly to the base plane XY. Thus, a layer typically has thickness along z, when it extends mainly along a plane XY, and a projecting element, for example a trench isolation, has a height along z. The relative terms "on", "under", "underlying" refer preferably to positions taken along the direction z.

The device according to different embodiments of the invention will now be described in reference to FIGS. 1A to 1F.

Figure 1B:
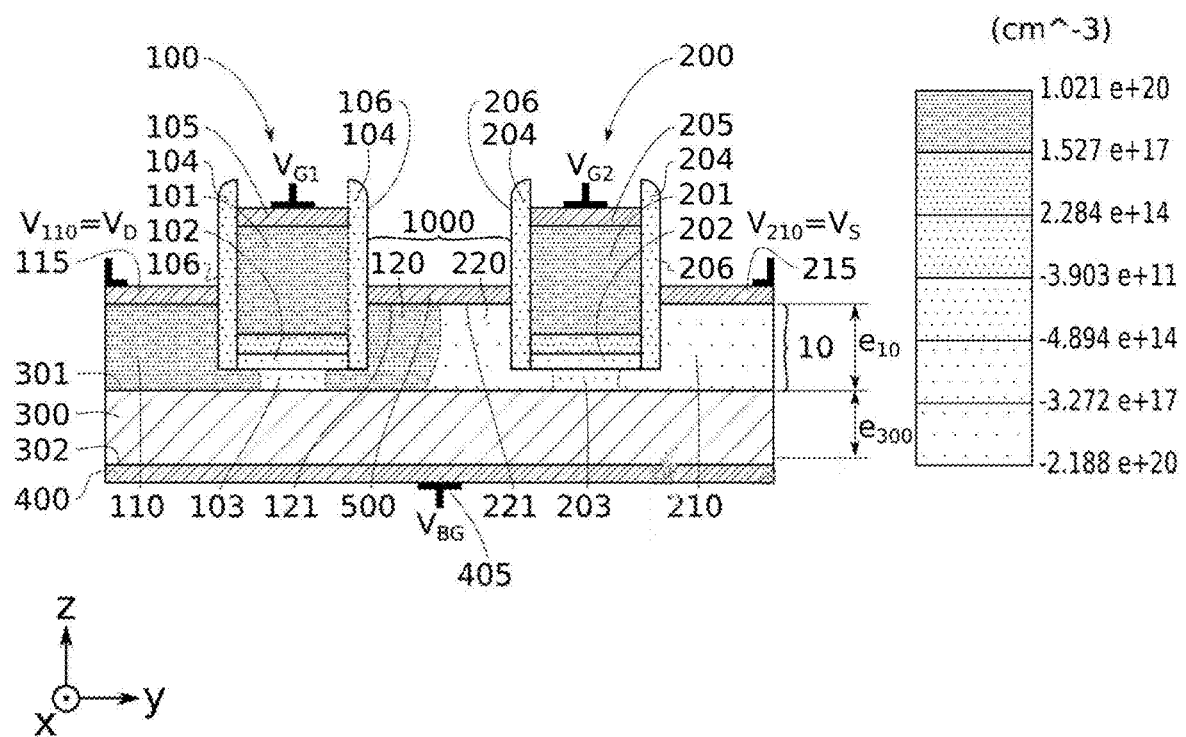

FIGS. 1A and 1B come from digital simulations. They constitute mappings of the doping within the device 1. FIGS. 1C to 1F are, themselves, schematic representations of the device 1. It must be noted that in FIGS. 1C to 1F, the N-doped zones are illustrated by a pattern having a cross shape and the P-doped zones by a pattern having a hyphen shape.

The device 1 comprises a first field-effect transistor 100 and a second field-effect transistor 200. Preferably, it does not comprise other transistors, or at the very least, no other transistors, a doped region of which forms a common electrode with a doped region of either of the two first transistors.

The first transistor 100 comprises a first drain, a first source, a first gate 101 and a first gate dielectric 102. As will be detailed further, this can be an n-MOS transistor, a p-MOS transistor or also a TFET transistor (Tunnel Field-Effect Transistor).

The first gate dielectric 102 extends under the first gate 101. The first doped zone 110 and the second doped zone 120 are each in contact with a first channel 103, called conduction channel, but which can also be a carrier depleted zone, separating them. This first channel 103 is in contact with the lower face of the first gate dielectric 102.

The first transistor 100 comprises, in addition, typically spacers 104 making it possible to isolate the first gate 101 from the first drain, on the one hand, and from the first source, on the other hand. These spacers 104 typically cover the side flanks of the first gate 101. They are, inter alia, intended to limit the interfering capacitive coupling between the first gate 101 and the first source on the one hand, and the first drain on the other hand.

The second transistor 200 comprises a second drain, a second source, a second gate 201, a second gate oxide 202 and a second channel 203, itself also called conduction channel, but which could also be a carrier depleted zone. The features of the first transistor 100 can be transposed mutatis mutandis to the second transistor 200.

The first transistor 100 and the second transistor 200 are separated by a distance L measured in the plane XY and defined as the distance between a flank 106 of the first transistor 100 and a flank 206 of the second transistor 200 facing it. The flanks 106, 206 of the transistors 100, 200 typically correspond to the flanks of the spacers 104, 204. The distance L is preferably greater than 50 nm. With the aim of optimising the density of devices which could be integrated on a chip, it is preferably less than 500 nm.

The first doped zone 110 and the second doped zone 120 can respectively constitute the first drain and the first source, or conversely.

Similarly, the device comprises a third doped zone 210 and a fourth doped zone 220 which could respectively constitute the second drain and the second source, or conversely.

The second doped zone 120 and the fourth doped zone 220 form a common electrode 1000.

If these two zones have the same doping type from among an N-type doping and a P-type doping, the simple fact that they are in contact makes it possible to create the common electrode 1000.

If, however, the second doped zone 120 and the fourth doped zone 220 have dopings of different types, the latter are short-circuited in order to form the common electrode 1000. Typically, to achieve this short-circuit, the presence of an electrically conductive layer 500 is provided, preferably metal, in contact with both the second doped zone 120 and with the fourth doped zone 220. This electrically conductive layer 500, that is also called metal layer 500, is a continuous layer ensuring the electrical connection of these two zones 120, 220. It is advantageously silicide-based, i.e. a material composed of silicon and of one or more metal elements. For example, it can be NiPtSi- or NiSi-based. It advantageously has an electrical resistivity level less than 150 µΩ·cm and typically greater than 5 µΩ·cm.

In this case, the term "layer" is meant in the broadest sense. This can relate to a deposition extending mainly in the plane XY, and to an element having low dimensions in to this plane.

Figure 1C:
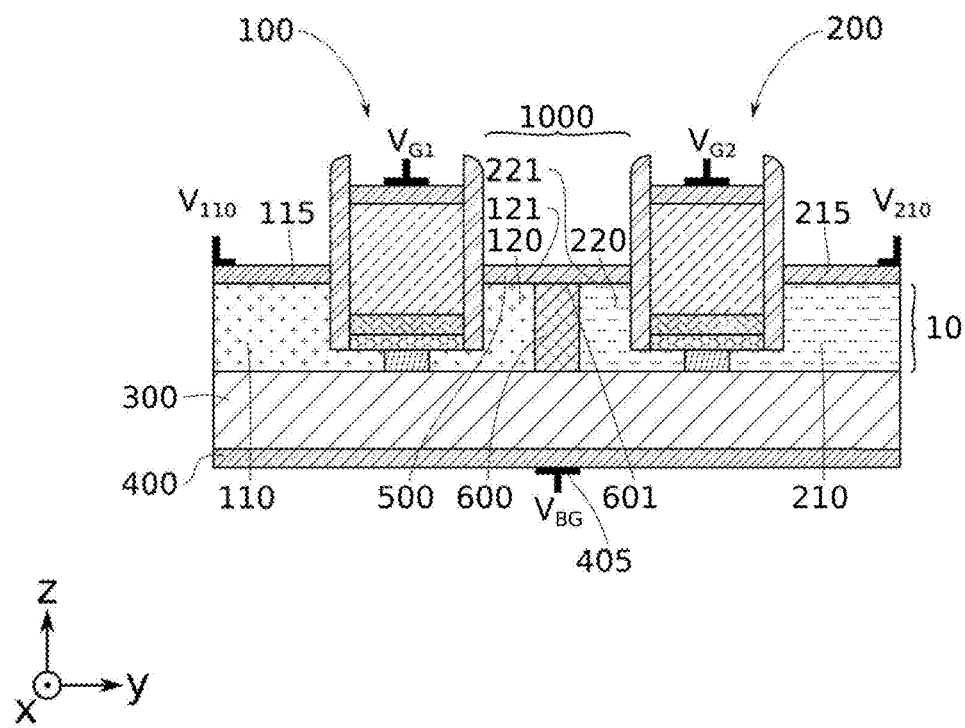
Figure 1D:
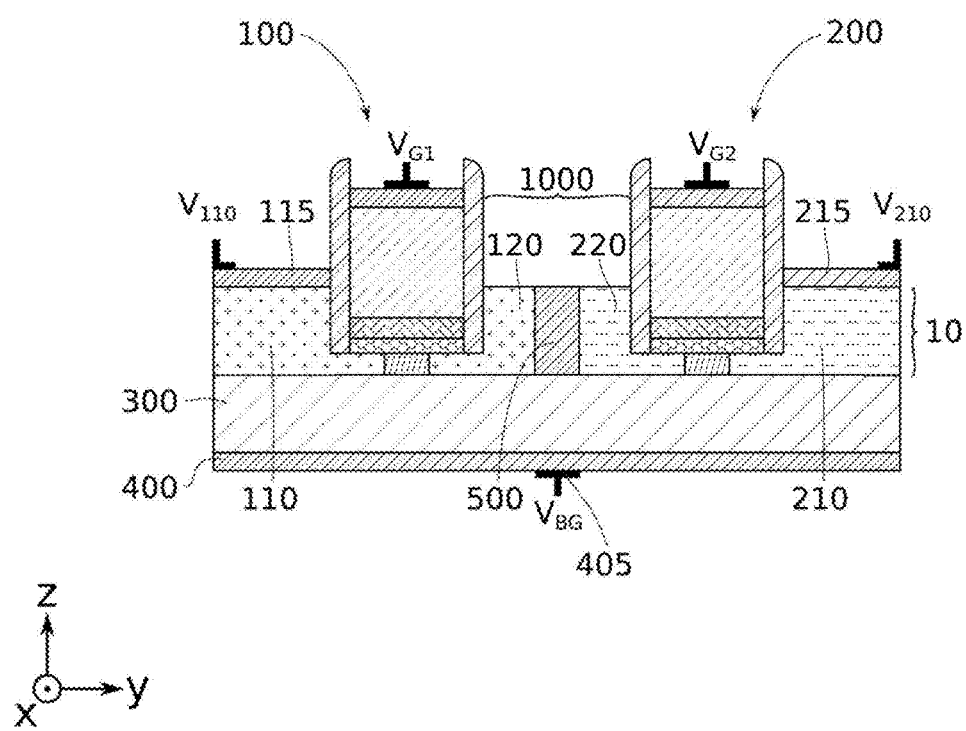

According to an embodiment illustrated in FIG. 1D, the metal layer 500 can separate, in the plane XY, the second and fourth doped zones 120, 220. According to another advantageous embodiment illustrated in FIGS. 1A and 1B, the second and fourth doped zones 120, 220 are in contact and the metal layer 500 directly covers at least one part of each of their upper surfaces 121, 221. Preferably, in this embodiment, the metal layer 500 extends into the plane XY of a flank 106 of the first transistor 100 to a flank 206 of the second transistor 200. Advantageously, the metal layer 500 covers all of the upper faces 121, 221 of the doped zones 120, 220. It is also possible that the layer 500 separates the second and fourth doped zones, while also covering them. It is also possible, as is illustrated in FIG. 1C, that the second doped zone 120 and the fourth doped zone 220 are separated in the plane XY by an isolating element 600 and electrically connected by way of the metal layer 500, this time covering both the upper surfaces 121, 221 of the second and fourth doped zones 120, 220 and the upper face 601 of the isolating element 600.

If the electrically conductive layer 500 is not necessary in the case where the second doped zone 120 and the fourth doped zone 220 have the same doping type (case illustrated in FIGS. 1E and 1F), it however can be considered that it is present.

The doped zones 110, 120, 210, 220 are preferably located in an active layer 10. This is preferably the same for the first channel 103 and the second channel 203. Thus, preferably, the doped zones 110, 120, 210, 220 and the channels 103, 203 are all with the basis of the same material: that of the active layer 10. The active layer 10 is preferably with the basis of at least one IV-IV material. For example, this material is silicon-based. The active layer 10 can also be with the basis of at least one III-V material, preferably with the basis of at least one III-N material. For example, this material is GaN-based. The active layer 10 can also be formed by transition-metal dichalcogenide (TMD) monolayers, for example of $MoS_2$- or $WS_2$-type. This can be a homogeneous layer, typically formed of one single material. The active layer 10 typically has an upper face 11 and a lower face 12 both extending mainly in the plane XY of the orthogonal system XYZ. It has, in the direction z, a thickness $e_{10}$. If the active layer 10 is silicon-based, the thickness $e_{10}$ typically varies from 5 nm to 50 nm. If, however, it is formed by two-dimensional materials, such as TMD monolayers, the active layer 10 can have a value of thickness $e_{10}$ as low as a few nanometres.

Certain elements constituting the transistors 100, 200 can have been at least partially formed from a continuous layer, called manufacturing layer. For example, certain regions of the manufacturing layer will have been able to be oxidised to form the gate dielectrics 103, 203 and/or the spacers 104, 204. The manufacturing layer can also have been etched, then different depositions will have been able to be performed on this manufacturing layer, in order to form the gate dielectrics 103, 203, spacers 104, 204 and/or gates 101, 201. The non-transformed or etched regions of the manufacturing layer thus form part of the active layer 10. The active layer 10 can, in addition, comprise zones having been epitaxially grown from the manufacturing layer.

The device 1 comprises, in addition, a dielectric layer 300 having an upper face 301 and a lower face 302 both extending mainly in planes parallel to the plane XY of the orthogonal system. The upper face 301 of the dielectric layer 300 is in contact with the first doped zone 110, with the second doped zone 120, with the third doped zone 210 and with the fourth doped zone 220. The dielectric layer 300 thus constitutes a buried dielectric common to the two transistors 100, 200 and therefore generally a buried dielectric for the device 1. It has, in the direction z, a thickness $e_{300}$.

The device 1 further comprises a rear gate 400 in contact with the lower face 302 of the dielectric layer 300.

The device 1 can comprise the following electrodes or tappings:

a first electrode 115 in contact with the first N-doped zone 110, a second electrode 215 in contact with the first P-doped zone 210,
a first gate electrode 105 in contact with the first gate 101,
a second gate electrode 205 in contact with the second gate 201,
a rear gate electrode 405 in contact with the rear gate 400, each of these electrodes being configured to be able to receive the application of the voltage. These electrodes are typically deposited metal layers in contact with each of the doped zones 110, 210 and gates 101, 201, 400.

More specifically, it is provided, in particular, that the following can be applied:
a first control voltage $V_{110}$ on the first electrode 115,
a second control voltage $V_{210}$ on the second electrode 215,
a first gate voltage $V_{G1}$ on the first electrode 105,
a second gate voltage $V_{G2}$ on the second electrode 205,
a rear gate voltage $V_{BG}$ on the rear gate electrode 405.

Preferably, all the electrodes 115, 215, 105, 205 and 405 are accessible—i.e. that voltages can be applied to them—from one same face, called front face of the device 1. With this in mind, the rear gate 400 advantageously projects with respect to the dielectric layer 300 so as to enable a tapping of said rear gate 400 from the front face of the device 1. The dielectric layer 300 can further, at this tapping, have an excess thickness. This excess thickness typically corresponds to the sum of the thickness e 300 of the dielectric layer 300 and of the thickness $e_{10}$ of the active layer 10. The rear gate electrode 405 is thus located at the level in the direction z with the first electrode 115 and the second electrode 215. This makes it possible to facilitate their simultaneous manufacture. Advantageously, thus the presence of at least one shallow trench isolation is provided (commonly called STI) making it possible to electrically isolate the rear gate 400 from the active layer 10.

Figure 10:
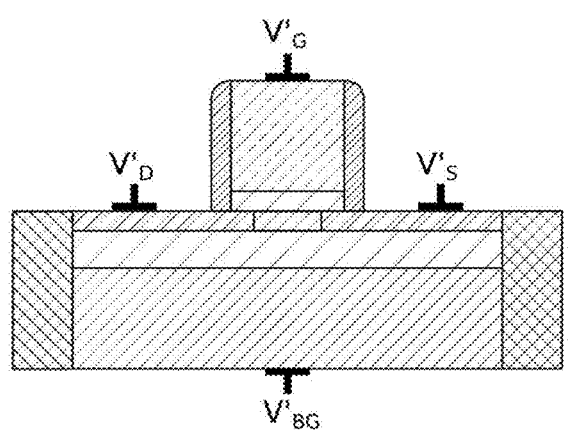
FIG. 10 represents an FDSOI transistor such as known from the prior art.

Thus, the behaviour of the device 1 can be controlled at five control points. FDSOI transistors, commonly used in the microelectronics industry, which have one single gate on the front face, can only be controlled at four control points (drain, source, front gate, rear gate, which can be seen in FIG. 10). Thanks to this additional control point, it is possible to control, more finely, the electrical behaviour of the device 1 with respect to a conventional FDSOI transistor. This also gives the device 1 additional functionalities and makes it possible to use it for other applications, as will be detailed further.

The first control voltage $V_{110}$ and the second control voltage $V_{210}$ constitute, for the device 1, respectively a drain voltage $V_D$ and a source voltage $V_S$, or conversely. More specifically:

If the first N-doped zone 110 constitutes the first source and the first P-doped zone 210, the second drain, thus the first control voltage $V_{110}$ constitutes the source voltage $V_S$ of the device 1 and the second control voltage $V_{210}$ constitutes the drain voltage $V_D$ of the device 1. This scenario is considered in FIG. 1A.

If the first N-doped zone 110 constitutes the first drain and the first P-doped zone 210, the second source, thus the first control voltage $V_{110}$ constitutes the drain voltage $V_D$ of the device 1 and the second control voltage $V_{210}$ constitutes the source voltage $V_S$ of the device 1. This scenario is considered in FIG. 1B.

According to the type of transistors 100, 200 (n-MOS, p-MOS, TFET), therefore of the doping type of the doped zones 110, 120, 210 and 220, the operation of the device 1 itself is similar to the operation of an n-MOS-, p-MOS- or TFET-type transistor. In the example illustrated in FIG. 1A, the first transistor 100 is an n-MOS-type transistor, the second transistor 200 is of the p-MOS type, the source of the device 1 is located at the first doped zone 110, which is, in this case, an N-doped zone, and the drain at the third doped zone 210, in this case, P-doped. In this configuration, the device 1 in operation will therefore have an n-TFET-type behaviour.

In the example illustrated in FIG. 1B, the transistors 100, 200 are of the same type as in the embodiment of FIG. 1A, but the control voltages $V_{110}$, $V_{210}$ applied are such that the source of the device 1 is located in the third doped zone 210, in this case, P-doped, and that the drain is located at the first doped zone 110, in this case, N-doped. In this configuration, the device 1 in operation will have a p-TFET-type behaviour.

It must be noted that the source or drain function of the zones 110, 120, 210 and 220 depends on the voltages which are applied to them, and more precisely, on the sign of the voltages $V_{110}$-$V_{120}$ and $V_{210}$-$V_{220}$. Thus, it is possible to make the device 1 pass from an n-TFET behaviour to a p-TFET behaviour, and conversely, by simply changing the sign of these voltage differences.

Figure 1E:
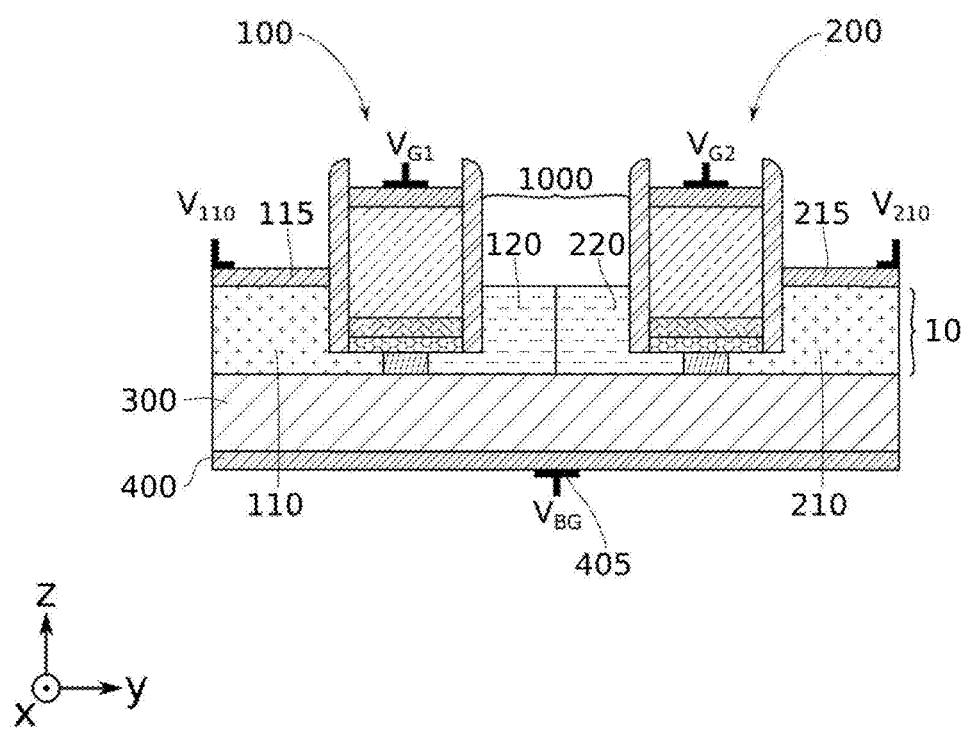
Figure 1F:
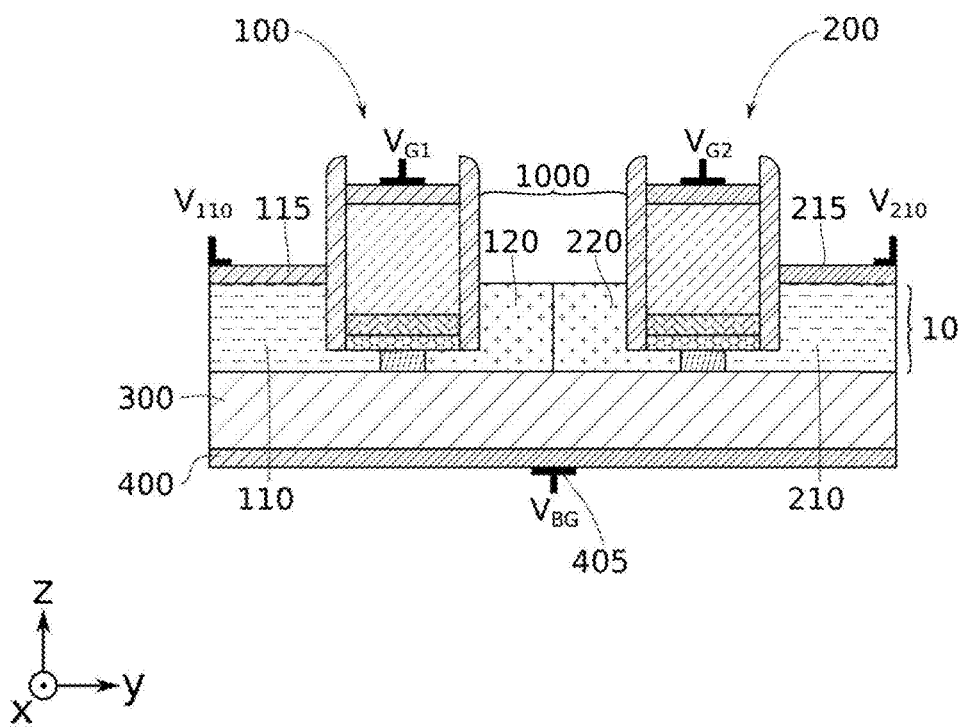

FIG. 1E illustrates a configuration, wherein the transistors 100, 200 are both of the TFET type and are disposed such that the common electrode 1000 is formed by the contact of the doped zones P of each of the transistors. In this example, the behaviour of the device 1 is similar to that of an n-MOS transistor. Conversely, in the example illustrated in FIG. 1F, the common electrode 1000 is formed by the contact of the N-doped zones of two TFET-type transistors 100, 200. The operation of the device is, this time, similar to that of a p-MOS transistor.

The rear gate voltage itself plays a major control role, in the device 1.

In the same way as a transistor of the state of the art, the device 1 can be in an on state or a blocked state. In the on state, the assembly constituted of the first channel 103, of the common electrode 1000 and of the second channel 203 constitutes a conduction channel for the device 1. The current can thus circulate between the source and the drain of the device 1. In the blocked state, the first channel 103 and the second channel 203 act as depleted channels for their respective transistors 100, 200. The assembly constituted from the first channel 103, from the common electrode 1000 and from the second channel 203 is thus depleted of carriers. No current thus circulates in the device 1.

All the simulations presented in FIGS. 2A to 5C and 7A to 9 now going to be described have been performed for a device 1 having the following features:

The first transistor 100 is an n-MOS-type transistor,
The second transistor 200 is a p-MOS-type transistor,
The first doped zone 110 constitutes the source of the n-MOS transistor 100 and the third doped zone 210 constitutes the drain of the p-MOS transistor 200 (n-FET-type behaviour). The drain-source voltage $V_{DS}=V_D-V_S$ of the device 1 is therefore defined by $V_{210}$-$V_{110}$. It must be noted that simulations based on a device 1 having a behaviour similar to a p-FET, n-MOS or p-MOS transistor would make it possible to draw on similar teachings about the functions that it makes it possible to perform.

Figures 2A, 2B:
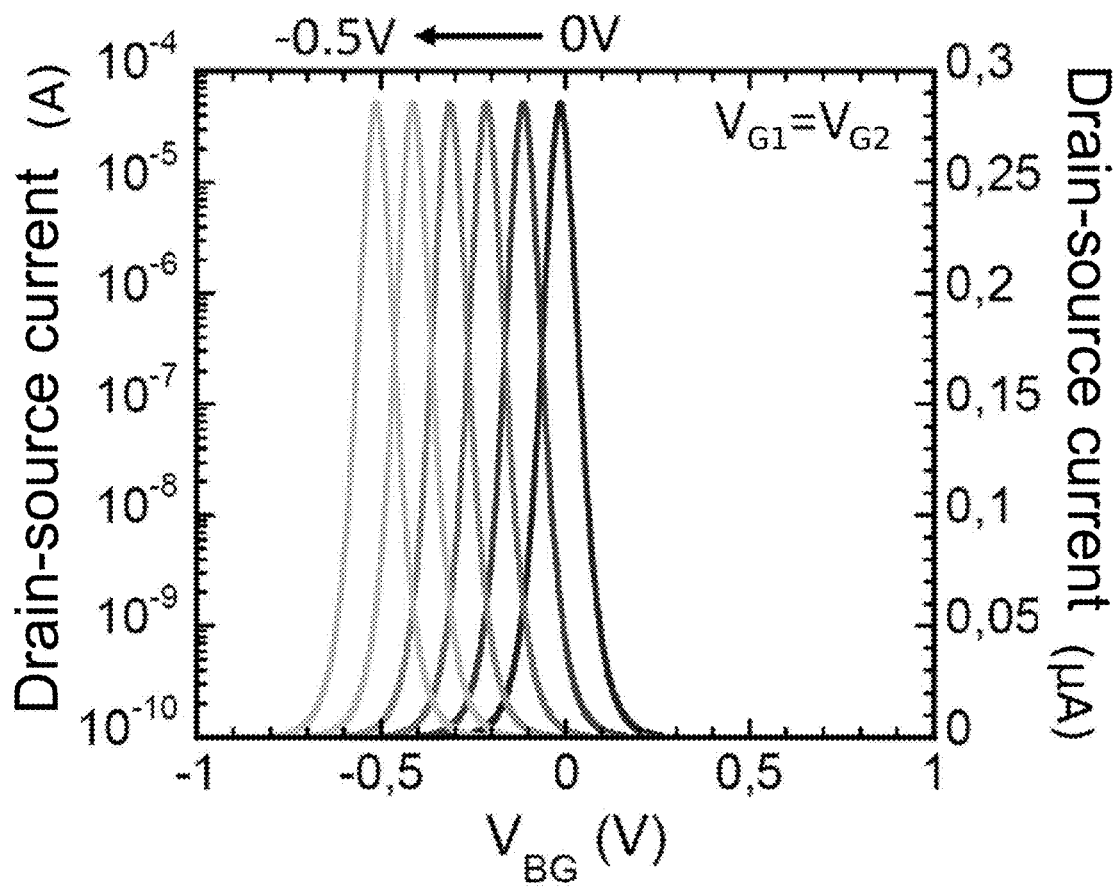
FIGS. 2A, 2C, 3A, 3C, 4A, 4C, 5A and 5C represent current-voltage features of the device according to one of the embodiments of the invention obtained by simulation. The curves of FIGS. 2A, 2C 3A and 3C are represented in a linear scale, the scale to be considered is therefore the scale represented on the right of each of these graphs.
FIGS. 2B, 2D, 3B, 3D, 4B, 4D, 5B and 5D are tables summarising the parameters applied during the simulations of FIGS. 2A, 2C, 3A, 3C, 4A, 4C, 5A and 5C.
Figures 2C, 2D:
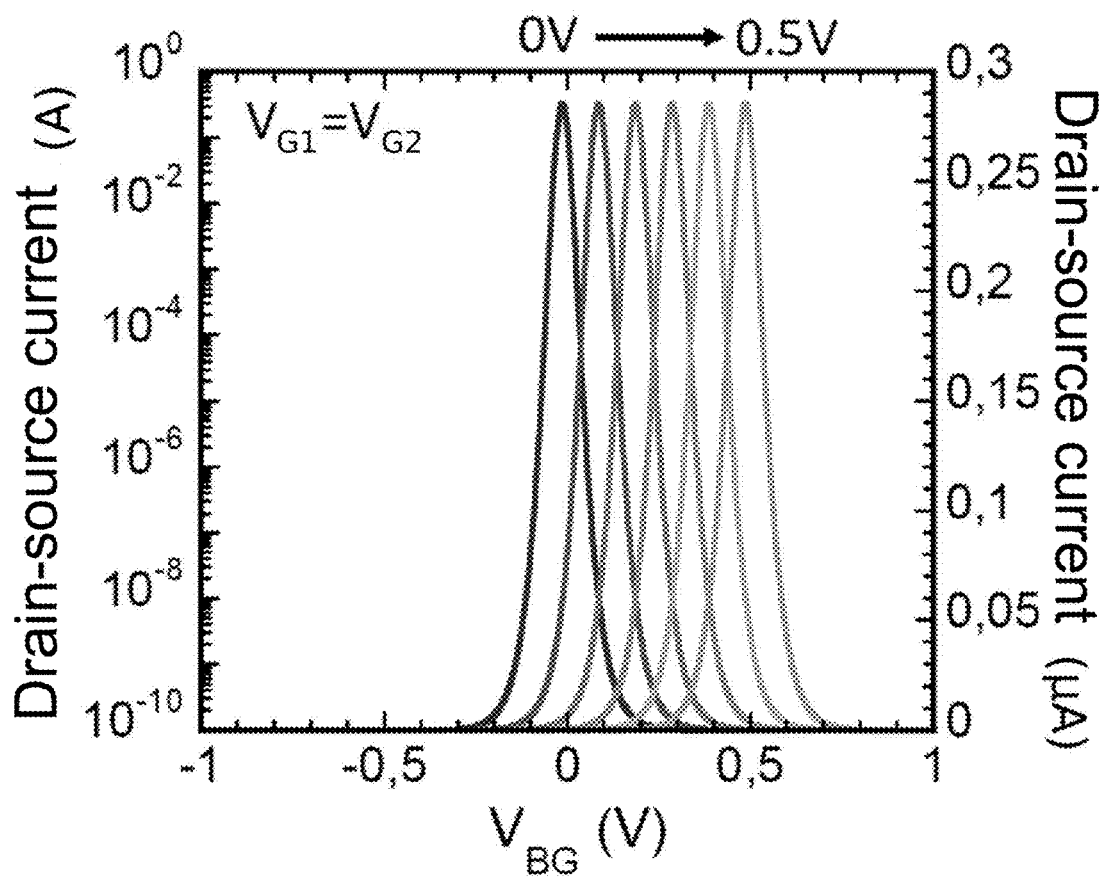

FIGS. 2A and 2C show current-voltage features $I_D$=f($V_{BG}$) of the device 1 obtained from an analytical model. During this simulation:

the first gate voltage $V_{G1}$ and the second gate voltage $V_{G2}$ have been set at one same value. The simulation has been performed for several values of $V_{G1}=V_{G2}$, varying from 0 to −0.5V (FIG. 2A) and from 0 to 0.5V (FIG.

2C). These different simulations correspond to the difference curves in FIGS. 2A and 2C.

the drain-source voltage $V_{Ds}$ has been set at a value of 0.5V. More specifically, $V_S$=0V and $V_D$=0.5V have been set.

the rear gate voltage $V_{BG}$ varies from −1V to 1V.

the evolution of the drain-source current $I_{DS}$ circulating in the device 1 according to $V_{BG}$ is noted.

These elements are summarised in the tables presented in FIGS. 2B and 2D.

These figures illustrate the option of generating from the device 1, a Gaussian-type feature. The FDSOI transistors commonly used in the industry do not make it possible to obtain these types of curves. In particular, they do not make it possible to obtain a negative differential resistance as is the case, in this case. In addition, as these figures illustrate, making the bias of the two gates 101, 201 vary, makes it possible to adjust the average Gaussian value. More specifically, in this case, decreasing the value of $V_{G1}$=$V_{G2}$ makes it possible to decrease the average value of the curve, and conversely. The applications of these properties of the device will be detailed further.

Figures 3A, 3B:
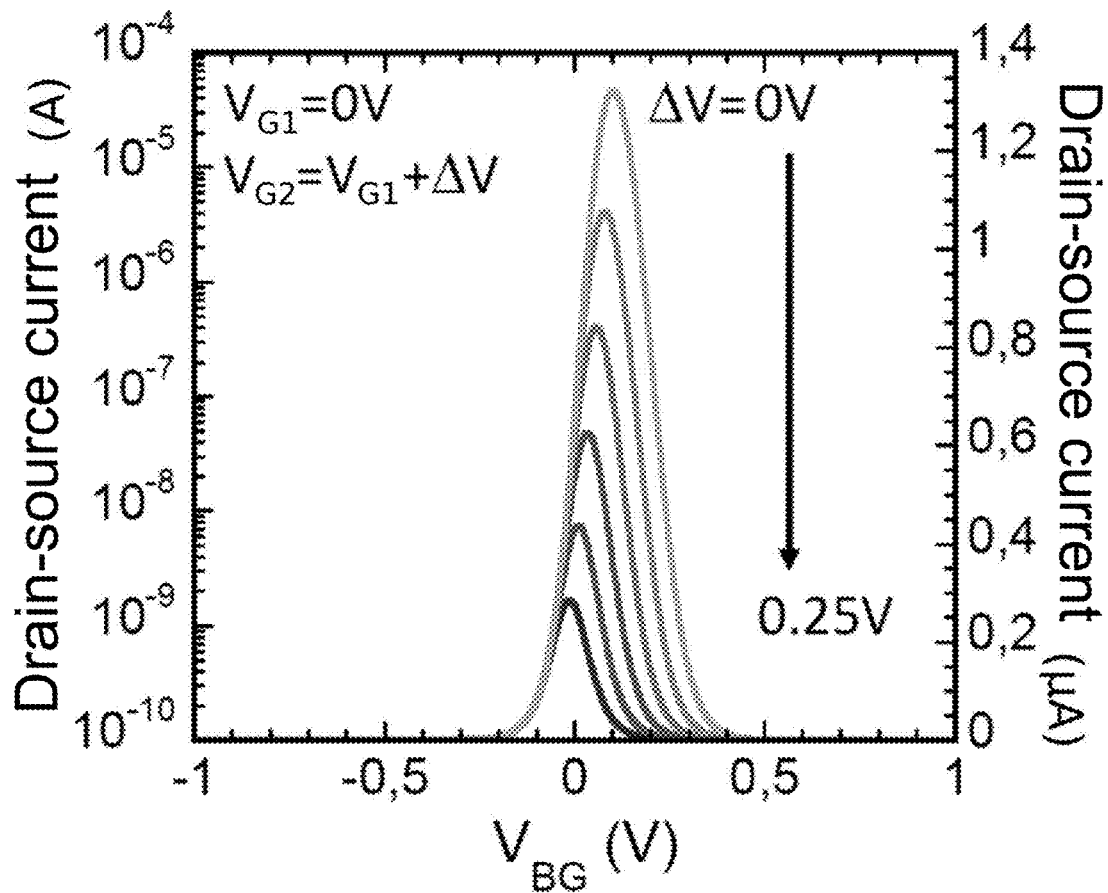
Figures 3C, 3D:
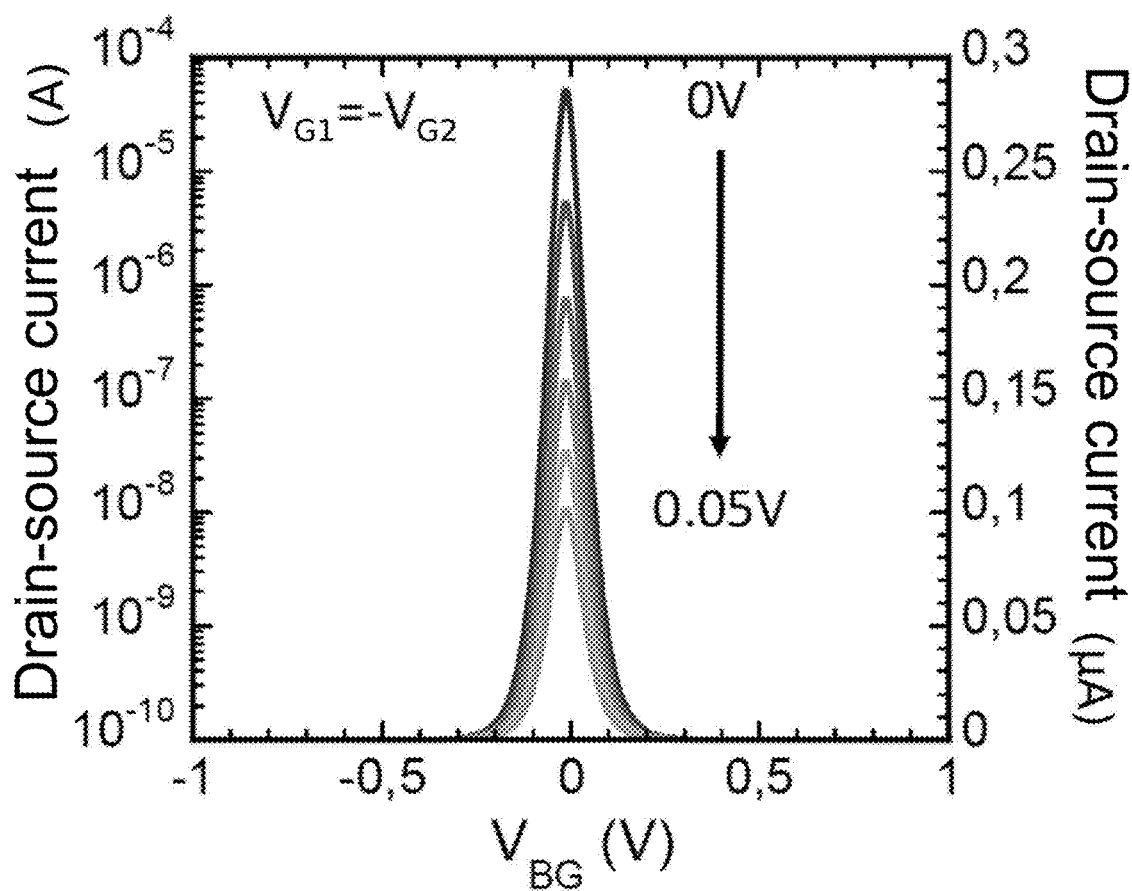

FIGS. 3A and 3C show the current-voltage features $I_D$=f($V_{BG}$) obtained from an analytical model of the device 1 for other relations linking $V_{G1}$ and $V_{G2}$. During these simulations:

the first gate voltage $V_{G1}$ and the second gate voltage $V_{G2}$ are linked by the following relations:
  i. FIG. 3A: $V_{G2}$=$V_{G1}$+ΔV with $V_{G1}$=0V. The simulation has been performed for several values of ΔV, varying from 0 to 0.25V. These different simulations correspond to the different curves in FIG. 3A.
  ii. FIG. 3C: $V_{G1}$=−$V_{G2}$. The simulation has been performed for several values of $V_{G1}$=−$V_{G2}$, varying from 0 to 0.05V. These different simulations correspond to the different curves in FIG. 3C.

the drain-source voltage $V_{DS}$ has been set at a value of 0.5V. More specifically, $V_S$=0V and $V_D$=0.5V have been set.

the rear gate voltage $V_{BG}$ varies from −1V to 1V.

the evolution of the drain-source current $I_{DS}$ circulating in the device 1 according to $V_{BG}$ is noted.

It is noted, that for these other relations between $V_{G1}$ and $V_{G2}$, the Gaussian-type features are also obtained.

These figures illustrate, in addition, that the choice of the voltages applied on the gates 101, 201 on the front face makes it possible to control both the average value, as has already been shown for $V_{G1}$=$V_{G2}$, and the Gaussian height. It is noted, in particular, in FIG. 3C, that for $V_{G1}$=−$V_{G2}$, an increase in absolute value of the gate voltages $V_{G1}$, $V_{G2}$ makes it possible to lower the value of the Gaussian height, while preserving a constant average value. FIG. 3A illustrates the combination of a variation of the average value and of the Gaussian height.

Thus, the presence of two gates 101, 201 on the front face enables a very accurate control of the shape and of the value characteristic of the current response of the device 1 to a voltage urging.

Figures 4A, 4B:
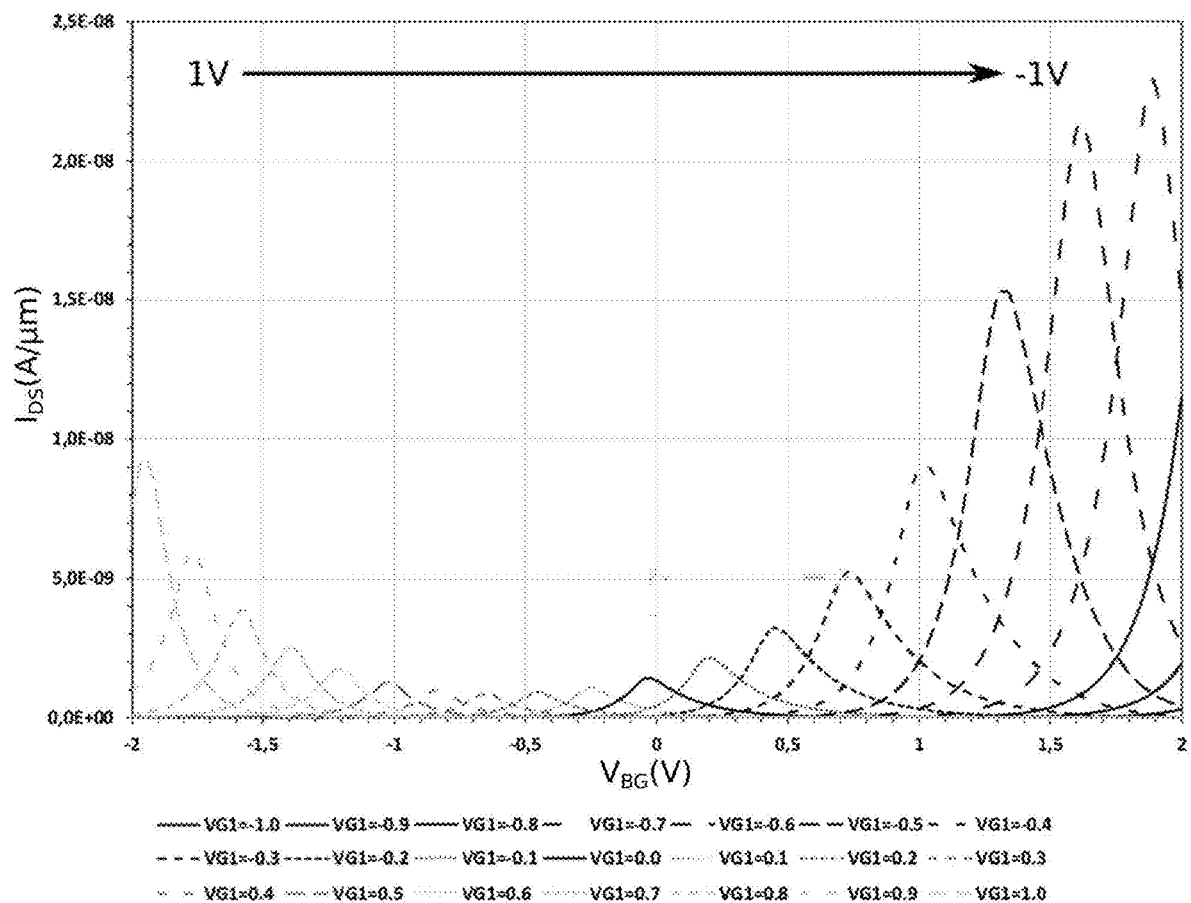
Figures 4C, 4D:
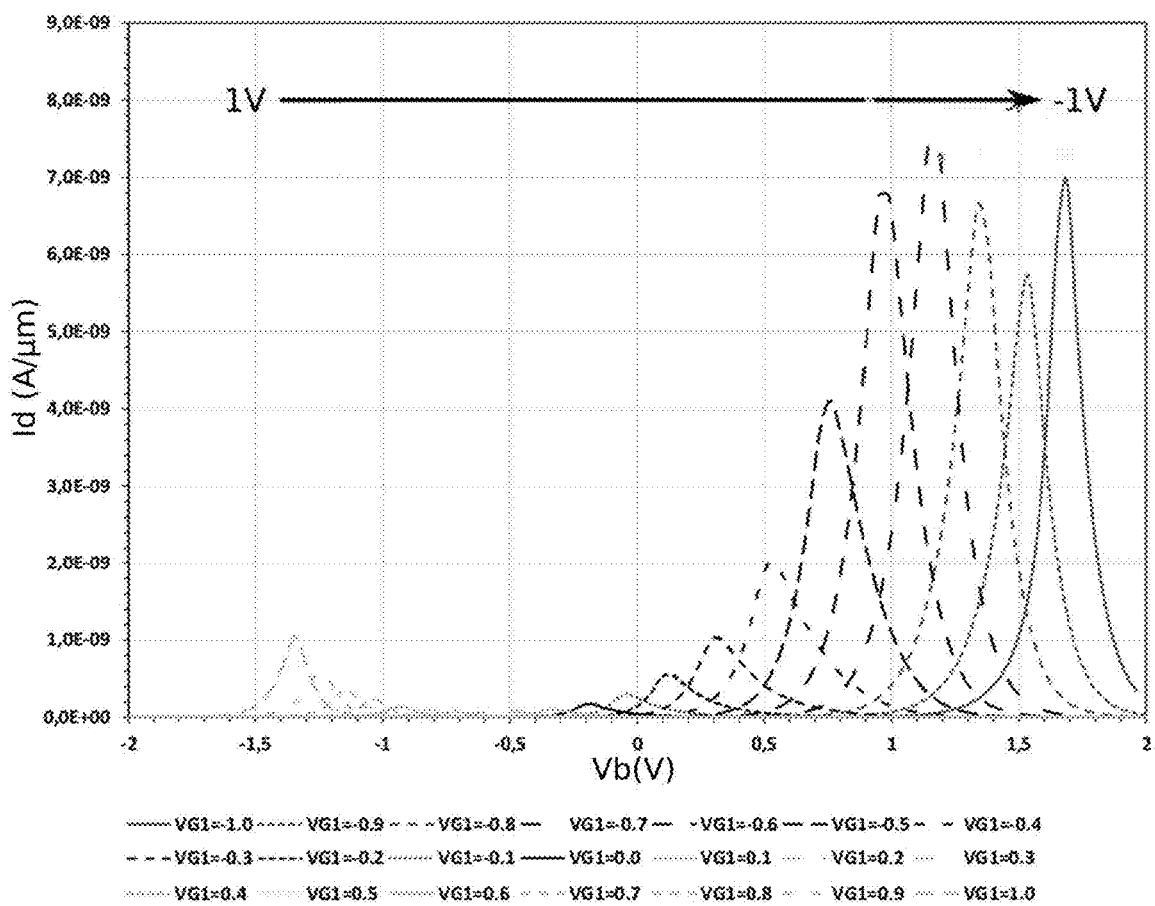
Figures 5A, 5B:
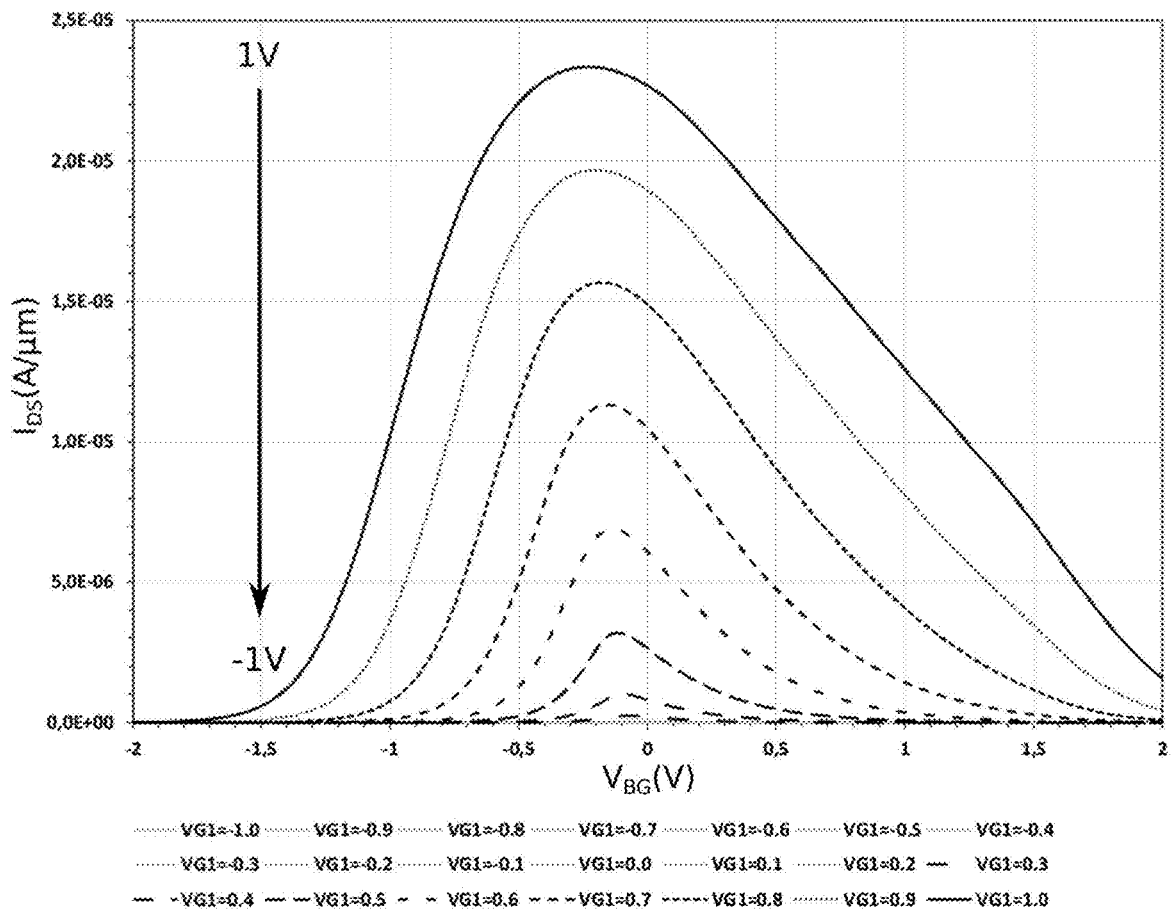
Figures 5C, 5D:
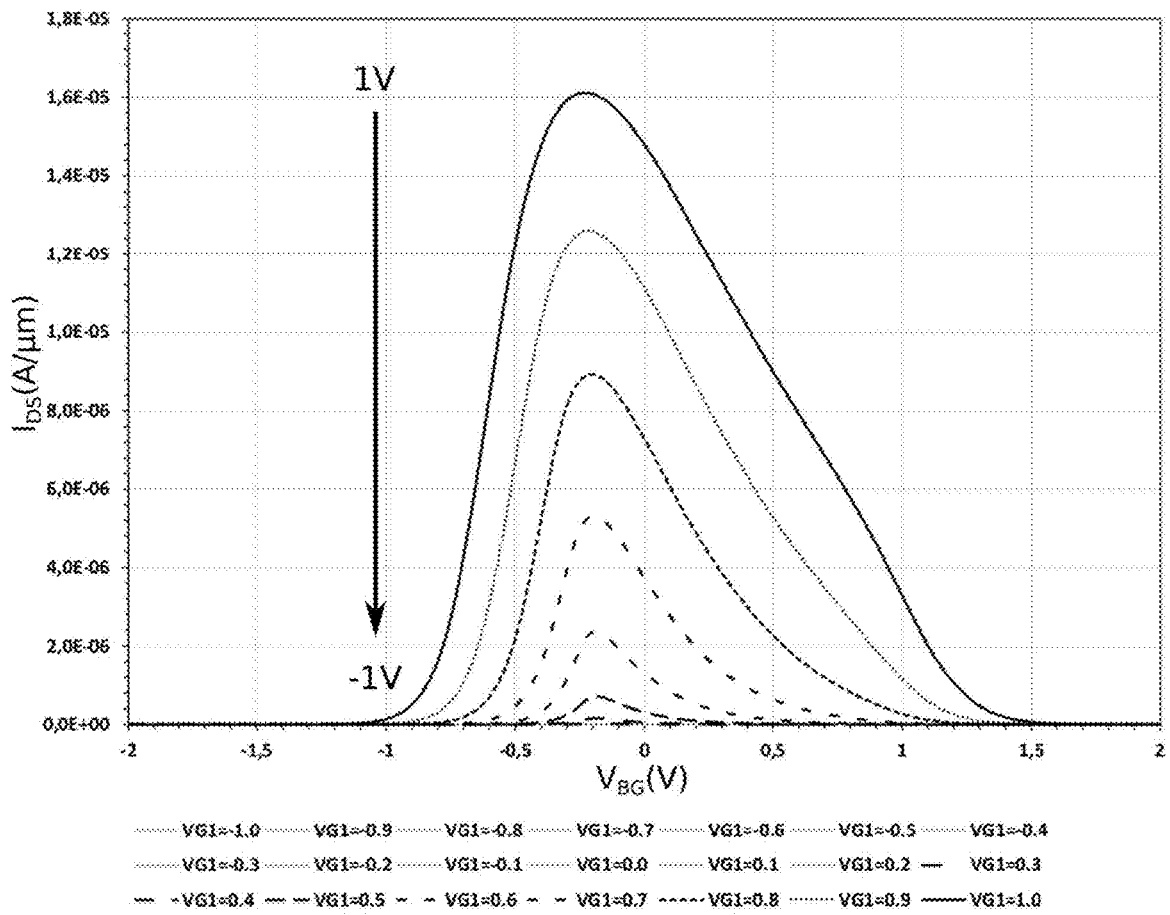

FIGS. 4A, 4C, 5A and 5C constitute a study of the impact of the thickness $e_{300}$ of the dielectric layer 300 on the operation of the device 1 by way of current-voltage features $I_D$=f($V_{BG}$) obtained by TCAD (Technology Computer-Aided Design) simulation. During these simulations:

the first gate voltage $V_{G1}$ and the second gate voltage $V_{G2}$ are linked by the following relations:
  i. FIGS. 4A and 4C: $V_{G1}$=$V_{G2}$. The simulations have been performed for several values of $V_{G1}$=$V_{G2}$, varying from −1V to 1V. These different simulations correspond to the different curves in FIGS. 4A and 4C.
  ii. FIGS. 5A and 5C: $V_{G1}$=−$V_{G2}$. The simulations have been performed for several values of $V_{G1}$=−$V_{G2}$, varying from −1V to 1V. These different simulations correspond to the different curves in FIGS. 4A and 4C.

the drain-source voltage $V_{DS}$ has been set at a value of 0.5V.

the rear gate voltage $V_{BG}$ varies from −2V to 2V.

the thickness $e_{300}$ of the dielectric layer 300 has been set at:
  i. 10 nm (1 nm=$10^{-9}$ m) during the simulations represented in FIGS. 4A and 5A.
  ii. 5 nm during the simulations represented in FIGS. 4C and 5C.

the evolution of the drain-source current $I_{DS}$ circulating in the device 1 according to $V_{BG}$ is noted.

These elements are summarised in the tables presented in FIGS. 4B, 4D, 5B and 5D.

It is noted, in particular, that whatever the relation linking $V_{G1}$ and $V_{G2}$, the thinner the dielectric layer 300 is, the narrower—and therefore the Gaussian standard deviation—is at mid-height. In other words, the thinner the buried dielectric 300 is, the better the electrostatic control of the rear gate 400 is on the current response of the device 1. For the targeted applications, it is interesting that the standard deviation is as low as possible. The thickness $e_{300}$ of the dielectric layer 300 is therefore advantageously minimised.

It must also be noted that, as FIGS. 3A and 3C illustrate, the thinner the dielectric layer 300 is, the more confined the Gaussians are for different values of $V_{G1}$=$V_{G2}$. Making the thickness $e_{300}$ vary, therefore also makes it possible to control the average Gaussian value.

Thus, the thickness $e_{300}$ of the dielectric layer 300 is another lever for adjusting the Gaussian features which could be generated by the device 1. This is, however, this time a parameter set during its manufacture and therefore intrinsic to the device. Typically, the thickness $e_{300}$ is greater than 2 nm and preferably less than 25 nm.

According to an embodiment, the gate dielectrics 102, 202 are with the basis of a ferroelectric material. For example, they can be $HfO_2$—, $HfZrO_2$—, $BaTiO_3$—, $Pb(Zr, Ti)O_3$— (commonly called PZT), $SrBi_2Ta_2O_9$—(SBT), $BiFeO_3$—(BFO) based, with the basis of a silicon-doped hafnium oxide (HZO), or with the basis of a material of the $Al_xSc_{1-x}N$-type.

Ferroelectric materials have the particularity of having a spontaneous bias, the bias direction of which can be modified under the action of an electric field and reversibly reversed. These materials are, in particular, characterised by:
  their temperature of $T_c$ below which they have a ferroelectric behaviour,
  their remanent bias $P_r$, which is the zero value of the field bias,
  their coercive field $E_c$, which is the value of the field to be applied for reversing the bias,
  and finally, their saturation bias $P_s$.

Figure 6:
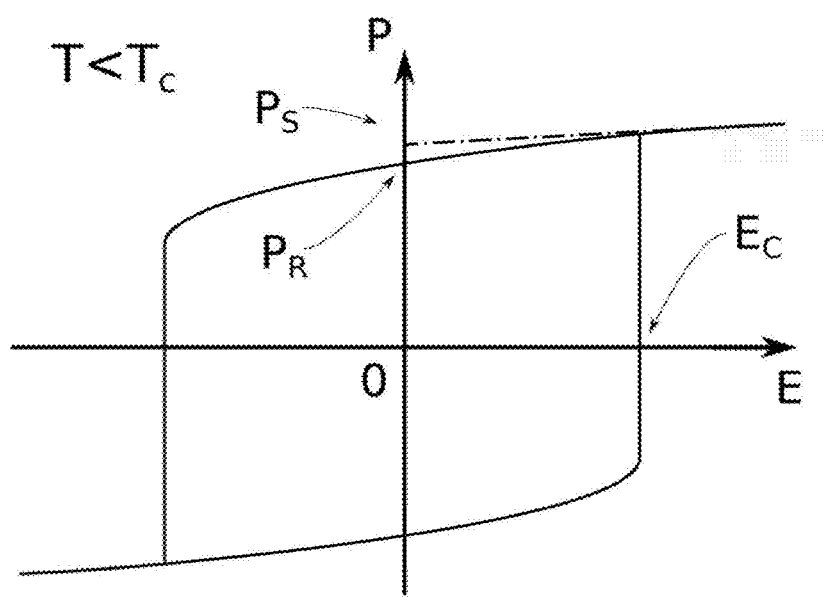
FIG. 6 illustrates the curve characteristic of the bias according to the applied field of a ferroelectric material in its ferroelectric phase.

The feature of the bias of a ferroelectric material in its ferroelectric phase (i.e. for $T<T_c$) according to the electric field being applied to it is illustrated in FIG. 6. A phenomenon of hysteresis is noted, which is commonly used in microelectronics for memory applications. There are, indeed, so-called FeFET transistors having a ferromagnetic gate on the front face and making it possible for each to store an information bit. In these devices, a brief pulse of the potential applied on the front gate of the FeFET induces a permanent and constant current $I_{DS}$. More specifically, this potential pulse, greater than (or less than) the coercive potential $+V_c$ (respectively $-V_c$), generates a constant bias $+P_r$ (respectively $-P_r$) of the ferroelectric material. This bias permanently induces a source-drain current, the intensity of which, according to the bias state of the ferromagnetic material, constitutes a memory state which can be read without destroying the information. In particular, the bias state, and therefore the information, is preserved when the gate potential is removed.

Figures 7A, 7B:
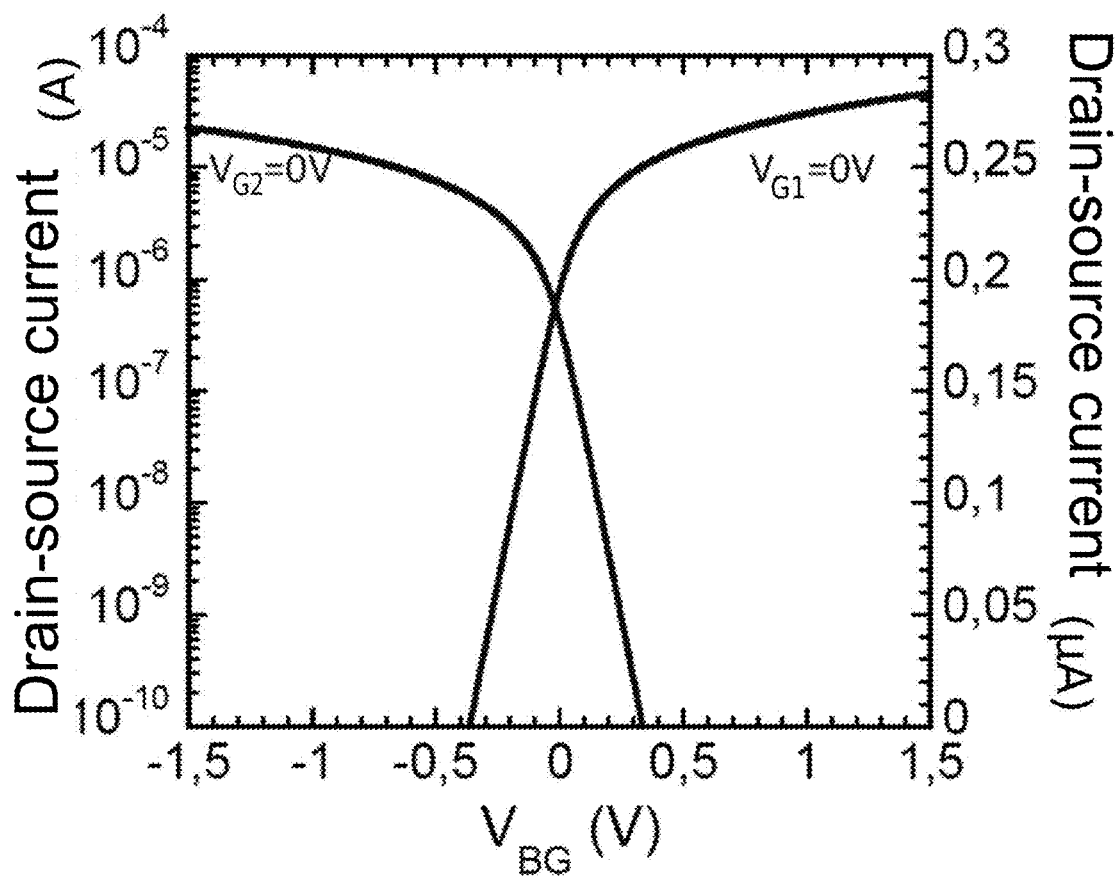
FIGS. 7A, 7C, 7E and 7G represent current-voltage features of the device according to one of the embodiments of the invention obtained by simulation. The curves of FIGS. 7A and 7C are represented in a logarithmic scale, the scale to be considered is therefore the scale represented on the left on each of these graphs. The curves of FIGS. 7E and 7G are represented in linear scale, the scale to be considered is therefore the scale represented on the right on each of these graphs.
FIGS. 7B, 7D, 7F and 7H are tables summarising the parameters applied during the simulations of FIGS. 7A, 7C, 7E and 7G.
Figures 7C, 7D:
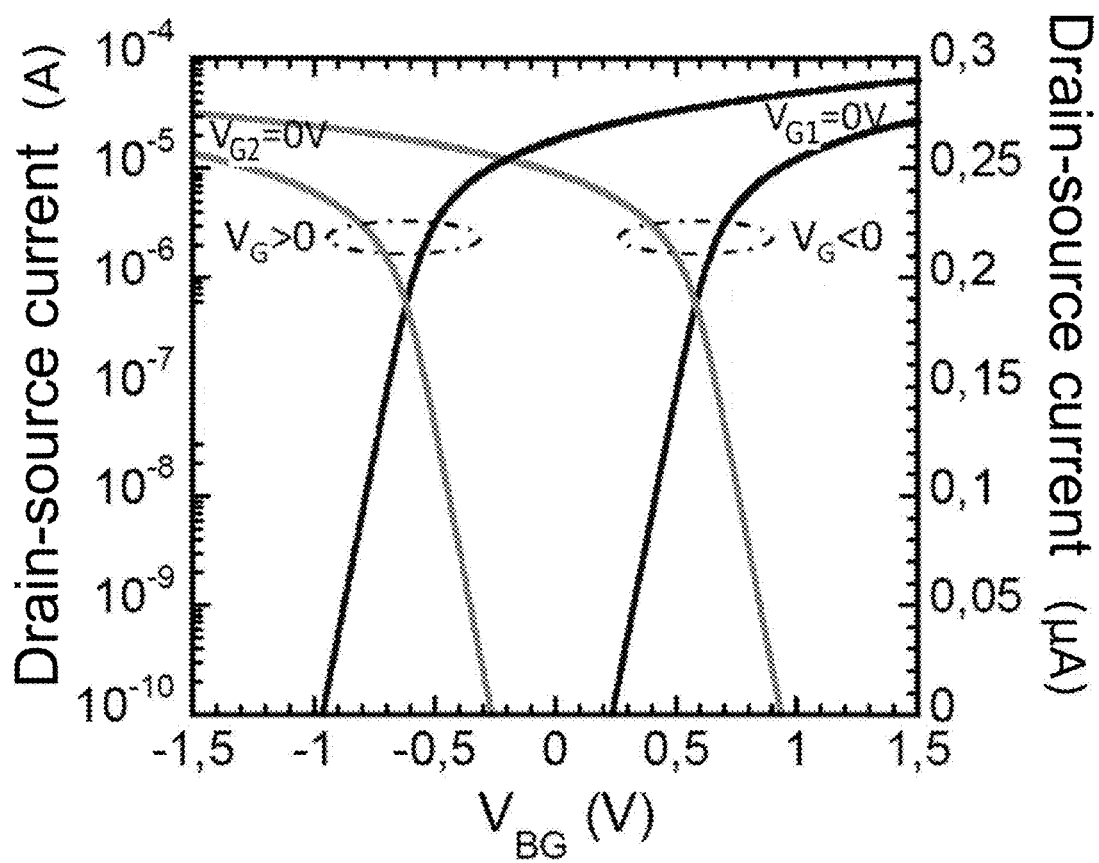
Figures 7E, 7F:
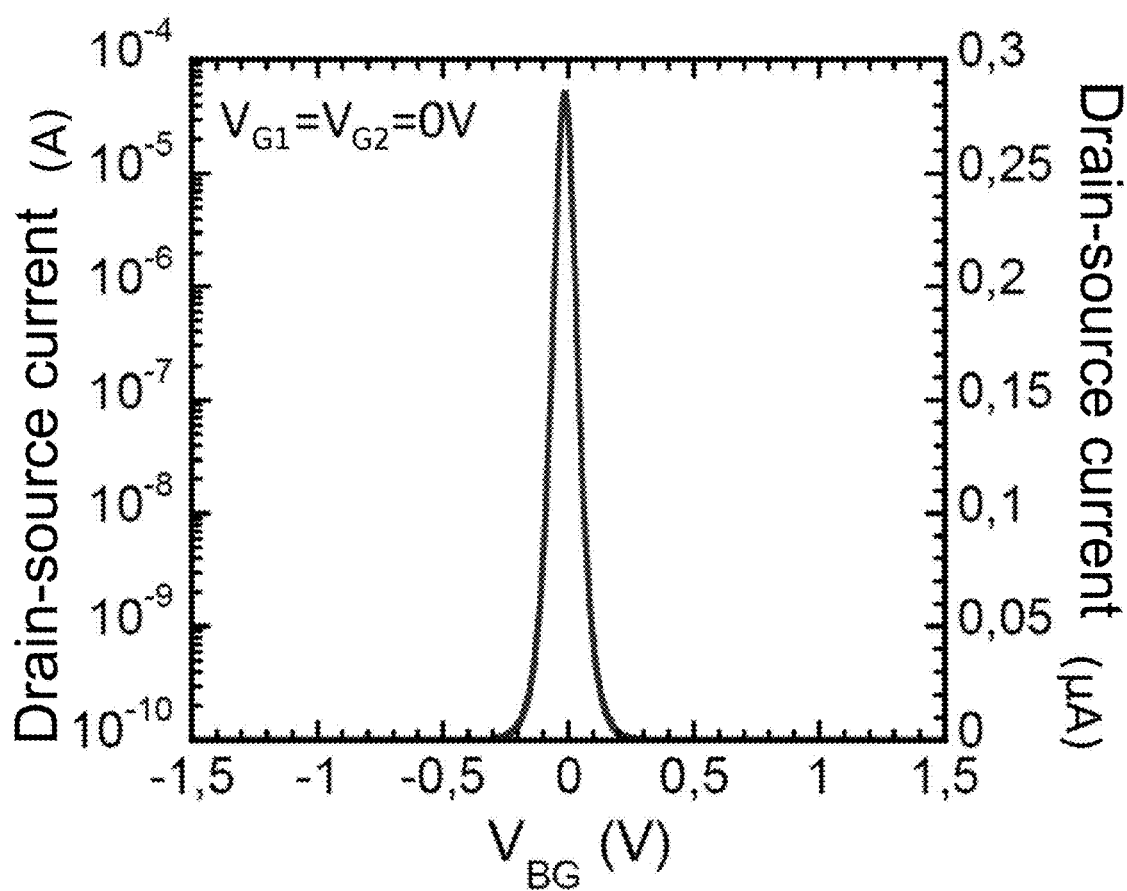
Figures 7G, 7H:
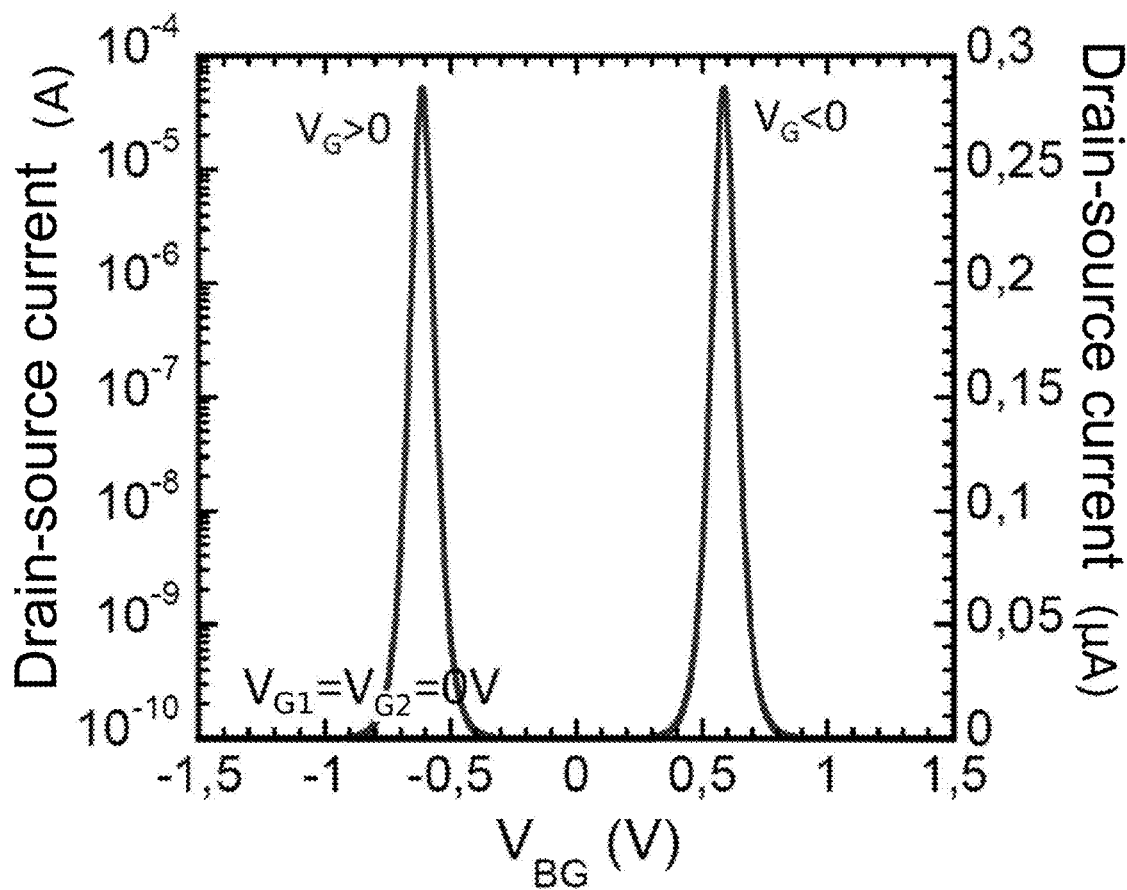

For example, after application of a gate voltage $V_{GB}$ greater than the coercive potential $+V_c$, the channel of the transistor becomes conductive and the resulting current encodes for a first piece of information (for example, a bit "1"). This information can be removed and changed into a second piece of information, such as a bit "0", by applying a gate voltage $V_{GS}$ less than $-V_c$. FIGS. 7A and 7C represent the current-voltage features of a transistor of the state of the art, respectively without and with ferromagnetic material. The two states could be utilised for memory applications which can be seen in FIG. 7C.

This principle can be applied to the device 1 according to the invention and even optimised. It is indeed possible to configure the gate voltages $V_{G1}$, $V_{G2}$ such that the two Gaussians of the current-voltage feature $I_D=f(V_{BG})$ of the device have average values located at voltage values enabling the production of logic gates. For example, the bias state of the gates on the front face 101, 201 (i.e. the voltages $V_{G1}$, $V_{G2}$) can constitute an input A, and the rear gate voltage $V_{BG}$ an input B. It is thus possible to encode:

A first Gaussian, corresponding to a first bias state, for an input value A "1", A second Gaussian, corresponding to a second bias state, for an input value A "0", A first rear gate voltage value $V_{BG,1}$ for an input value B "0", and A second rear gate voltage value $V_{BG,2}$ for an input value B "1".

Figure 8A:
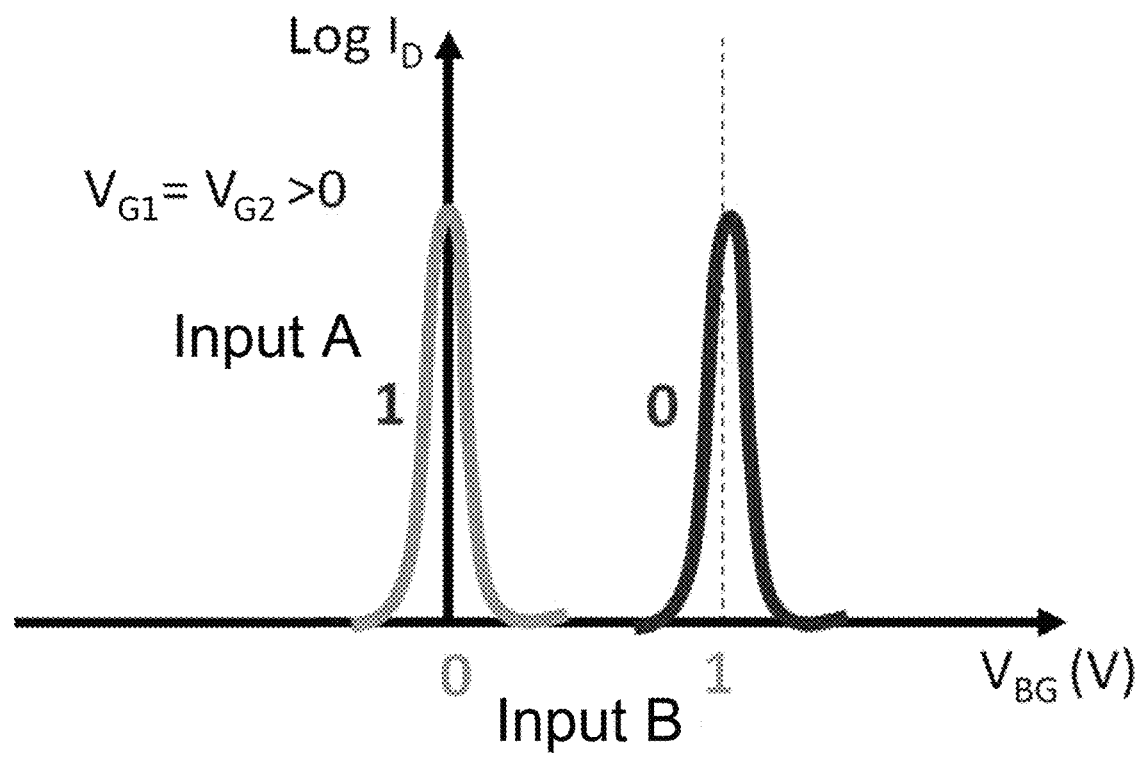
FIGS. 8A and 8B illustrate an application which could be made of the device according to one of the embodiments of the invention.

All of the elementary logic gates can thus be produced. For example, FIG. 8A illustrates the production of an "XOR" logic gate. In this configuration:

The average value of the first Gaussian is equal to $V_{BG,1}$, and

The average value of the second Gaussian is equal to $V_{BG,2}$.

Thus, if the device 1 is in the first bias state (input A="1") and if the rear gate voltage is set at $V_{BG,1}$ (input B="0"), the device 1 is on and a current $I_D$ can be noted, thus encoding for a bit "1". However, for any other value of $V_{BG}$, the current $I_D$ will be zero (or at least significantly lower), thus encoding for a bit "0". If, this time, the device 1 is in the second bias state (input A="0") and if the rear gate voltage is set at $V_{BG,2}$ (input B="1"), the device 1 is on and a current $I_D$ can be noted, thus encoding for a bit "1". However, for any other value of $V_{BG}$, the current $I_D$ will be zero (or at least significantly lower), thus encoding for a bit "0". These different scenarios are summarised in table 1. As the last column of this table shows, this configuration makes it possible to perform an "XOR" logic function.

| Physical parameter | $V_{G1}$, $V_{G2}$ | $V_{BG}$ | $I_D$ |
| --- | --- | --- | --- |
| Logic equivalent | A | B | A XOR B |
| Value | 0 | 0 | 0 |
| | 0 | 1 | 1 |
| | 1 | 0 | 1 |
| | 1 | 1 | 0 |

Figure 8B:
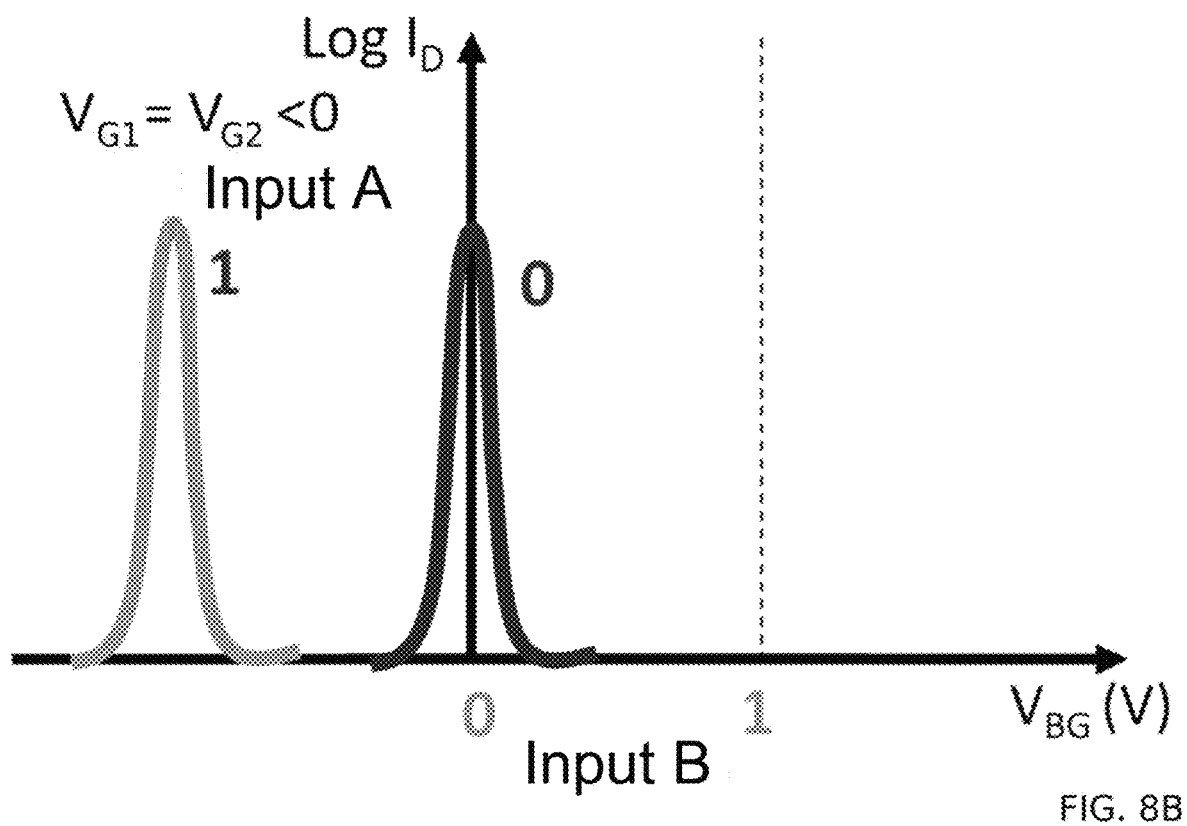

FIG. 8B itself illustrates the embodiment of a "NOR" logic gate. In this configuration:

The average value of the first Gaussian is different from $V_{BG,1}$ and from $V_{BG,2}$, and The average value of the second Gaussian is equal to $V_{BG,1}$.

Thus, if the device is in the first bias state (input A="1"), whatever the value of the rear gate voltage (input B="0" or "1"), the device 1 is blocked. No current can be noted (or only a very low current), thus encoding for a bit "0". If, this time, the device 1 is in the second bias state (input A="0") and if the rear gate voltage is set at $V_{BG,1}$ (input B="0"), the device 1 is on and a current $I_D$ can be noted, thus encoding for a bit "1". However, for any other value of $V_{BG}$, the current $I_D$ will be zero (or at least significantly lower), thus encoding for a bit "0". These different scenarios are summarised in table 2. As the last column of this table shows, this configuration makes it possible to perform a "NOR" logic function.

| Physical parameter | $V_{G1}$, $V_{G2}$ | $V_{BG}$ | $I_D$ |
| --- | --- | --- | --- |
| Logic equivalent | A | B | A NOR B |
| Value | 0 | 0 | 1 |
| | 0 | 1 | 0 |
| | 1 | 0 | 0 |
| | 1 | 1 | 0 |

It has been shown that the device 1 could make it possible to produce XOR and NOR logic gates, but it is understood that all the other elementary logic gates (AND, OR, NOT, NAND, XNOR) can be produced by adapting the position of the first and second Gaussians.

Thus, by a simple adjustment of the two gate voltages $V_{G1}$, $V_{G2}$, the device 1 makes it possible to effectively produce all of the elementary logic gates, which conventional FDSOI transistors do not enable, which, themselves, can only be controlled at one single front gate.

According to an embodiment, the device 1 comprises a control circuit, making it possible to apply the voltages mentioned above on each of the electrodes. The control to circuit further makes it possible to make the voltages $V_{110}$, $V_{210}$, $V_{G1}$, $V_{G2}$ and $V_{BG}$ vary, for example in a given range, such that [−5V, 5V].

The control circuit is advantageously configured to be able to generate features having a Gaussian form.

The generation of a Gaussian-type feature can, in particular, be useful in in-memory computing applications. For example, it is possible to produce non-volatile memory cells serving to perform elementary logic operations by utilising the device 1 such as described above.

Figure 9:
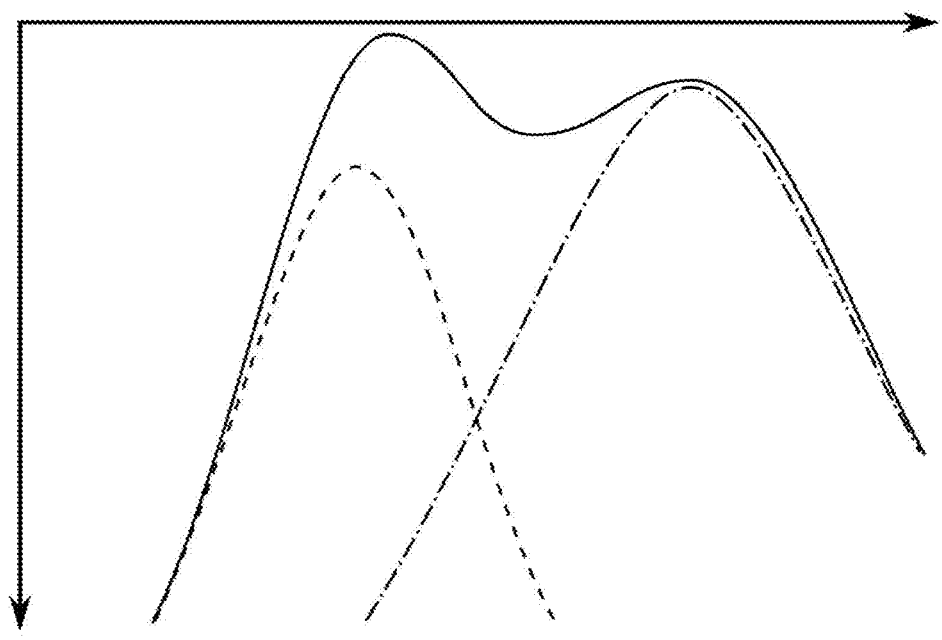
FIG. 9 represents the Gaussian mixture obtained by linear combination of several Gaussian components.

The device 1 could also be used for classification applications, for example in the machine learning field. The classification is an important aspect of analysing exploratory and decision-making data. It aims to determine if a set of objects is homogenous and, when it is not, to establish a partition of this collection in homogenous subassemblies called classes. The Gaussian mixture model, illustrated in FIG. 9, is a linear combination (solid curve) of several Gaussian components (dotted line curve). It is particularly used in the case where the data in studies cannot be modelled by a simple Gaussian. In other words, if the data structure is naturally composed of several groups, they must be represented by a Gaussian mixture model, rather than a simple Gaussian distribution.

Still in the scope of machine learning, the Gaussians generated by the device 1 could also be used to define the synaptic weight between two neurones, in particular in the study of Bayesian neural networks.

The invention is not limited to the embodiments described above and extends to all embodiments covered by the invention.

The invention claimed is:

1. A microelectronic device comprising:
a first field-effect transistor comprising a first drain, a first source, a first gate), a first gate dielectric, and a first channel,
a first doped zone, constituting one from among the first drain and the first source,
a second doped zone, constating the other from among the first drain and the first source,
a second field-effect transistor comprising a second drain, a second source, a second gate and a second gate dielectric, and a second channel,
a third doped zone, constating the second source if the first doped zone constitutes the first drain, or the second drain, if the first doped zone constitutes the first source,
a fourth doped zone, constituting the other from among the second drain and the second source,
a dielectric layer having an upper face in contact with the first doped zone, with the second doped zone, with the third doped zone and with the fourth doped zone, and
a rear gate in contact with a lower face of the dielectric layer, wherein
the second doped zone and the fourth doped zone form a common electrode,
the first doped zone, the second doped zone, the first channel, the third doped zone, the fourth doped zone and the second channel are based upon the same material,
the second doped zone and the fourth doped zone have a doping of a same type from among an N-type doping and a P-type doping, and
the first doped zone and the third doped zone have a doping opposite that of the second and fourth doped zones.

2. The device according to claim 1, wherein the second doped zone and the fourth doped zone are electrically connected by an electrically conductive layer.

3. The device according to claim 2, wherein the electrically conductive layer is metal silicide-based.

4. The device according to claim 2, wherein the electrically conductive layer directly covers at least one part of an upper face of the second doped zone and at least one part of an upper face of the fourth doped zone.

5. The device according to claim 2, wherein the electrically conductive layer directly covers a part of the upper face of the dielectric layer and separates the second doped zone from the fourth doped zone.

6. The device according to claim 1 comprising a first electrode and a second electrode, wherein the first doped zone is in contact with the first electrode which is configured to receive a first control voltage and the third doped zone is in contact with the second electrode which is configured to receive a second control voltage.

7. The device according to claim 6, wherein:
the first control voltage constitutes a source voltage of the device and the second control voltage constitutes a drain voltage of the device, or
the second control voltage constitutes a source voltage of the device and the first control voltage constitutes a drain voltage of the device.

8. The device according to claim 1 comprising a first gate electrode and a second gate electrode, and wherein the first gate is in contact with the first gate electrode which is configured to receive a first gate voltage $V_{G1}$ and the second gate is in contact with the second gate electrode which is configured to receive a second gate voltage $V_{G2}$.

9. The device according to claim 1 comprising a rear gate electrode, and wherein the rear gate is in contact with the rear gate electrode which is configured to receive a rear gate voltage.

10. The device according to claim 6, further comprising:
a first gate electrode and a second gate electrode, the first gate being in contact with the first gate electrode and the second gate being in contact with the second gate electrode,
a rear gate electrode, the rear gate being in contact with the rear gate electrode, and
a control circuit configured to apply:
the first control voltage on the first electrode,
the second control voltage on the second electrode,
a first gate voltage $V_{G1}$ on the first gate electrode,
a second gate voltage $V_{G2}$ on the second gate electrode,
a rear gate voltage on the rear gate electrode,
the first control voltage, the second control voltage, the first gate voltage $V_{G1}$, the second gate voltage $V_{G2}$ and the rear gate voltage being able to take different values.

11. The device according to claim 10, wherein $V_{G2}=\pm V_{G1}+\Delta V_G$, with $\Delta V_G$ between −5 and +5V.

12. The device according to claim 10, wherein $V_{G2}=V_{G1}$.

13. The device according to claim 10, wherein $V_{G2}=-V_{G1}$.

14. The device according to claim 1, wherein the first transistor and the second transistor are separated by a distance L greater than 50 nm.

15. The device according to claim 1, wherein the dielectric layer has a lower face, a thickness between the lower face and the upper face being less than or equal to 25 nm.

16. The device according to claim 1, wherein the first gate dielectric and the second gate dielectric are based upon a ferroelectric material.

17. A non-volatile memory storage unit comprising at least one device according to claim 16.

18. A method for controlling the device or the storage unit according to claim 17, wherein
a first control voltage is applied to the first doped zone and a second control voltage is applied to the first doped zone, and
the first control voltage constitutes a source voltage of the device and the second control voltage constitutes a drain voltage of the device, or
the second control voltage constitutes the source voltage of the device and the first control voltage constitutes the drain voltage of the device.

* * * * *